United States Patent
Fujiwara et al.

(10) Patent No.: US 12,068,432 B2
(45) Date of Patent: Aug. 20, 2024

(54) DISPLAY DEVICE AND METHOD OF MANUFACTURING SAME

(71) Applicant: OSAKA UNIVERSITY, Suita (JP)

(72) Inventors: Yasufumi Fujiwara, Suita (JP); Takeshi Uenoyama, Suita (JP); Jun Tatebayashi, Suita (JP); Shuhei Ichikawa, Suita (JP)

(73) Assignee: OSAKA UNIVERSITY, Osaka (JP)

( * ) Notice: Subject to any disclaimer, the term of this patent is extended or adjusted under 35 U.S.C. 154(b) by 502 days.

(21) Appl. No.: 17/343,239

(22) Filed: Jun. 9, 2021

(65) Prior Publication Data

US 2021/0296528 A1    Sep. 23, 2021

Related U.S. Application Data

(63) Continuation of application No. PCT/JP2019/047334, filed on Dec. 4, 2019.

(30) Foreign Application Priority Data

Dec. 14, 2018   (JP) ................................ 2018-234965
Aug. 7, 2019    (JP) ................................ 2019-145022

(51) Int. Cl.
*H01L 33/08*   (2010.01)
*H01L 33/00*   (2010.01)
(Continued)

(52) U.S. Cl.
CPC .......... *H01L 33/08* (2013.01); *H01L 33/0025* (2013.01); *H01L 33/10* (2013.01);
(Continued)

(58) Field of Classification Search
CPC .............................. H01L 27/156; H01L 33/08
See application file for complete search history.

(56) References Cited

U.S. PATENT DOCUMENTS 7,605,531 B1 * 10/2009 Lebby ................... H01L 27/156
                                                      313/498
2008/0251799 A1   10/2008 Ikezawa
(Continued)

FOREIGN PATENT DOCUMENTS

JP   7-183576 A    7/1995
JP   11-74566 A    3/1999
(Continued)

OTHER PUBLICATIONS

International Preliminary Report on Patentability (form IPEA 409), with a completion date of Nov. 30, 2020, for International Application No. PCT/JP2019/047334, with an English translation.
(Continued)

*Primary Examiner* — Peter M Albrecht
(74) *Attorney, Agent, or Firm* — Birch, Stewart, Kolasch & Birch, LLP

(57) ABSTRACT

Provided is a display device including a light emitting unit that can emit a plurality of types of light having different wavelengths to the outside at a desired ratio with high intensity without increasing manufacturing costs in proportion to a number of pixels even when the number of pixels increases. Provided is a display device including a light emitting unit in which a plurality of types of PiN junction-type light emitting diodes that emit light having different wavelengths are arranged on the same substrate, and at least one type among the plurality of types of light emitting diodes has an active layer containing a rare earth element. Provided is a display device in which a plurality of types of light emitting diodes are sequentially stacked on the surface of a substrate, and a light emitting layer for one color is formed to overlap at least a portion of a light emitting layer for another color.

20 Claims, 18 Drawing Sheets

(51) Int. Cl.
  *H01L 33/10* (2010.01)
  *H01L 33/24* (2010.01)
  *H01L 33/32* (2010.01)
  *H01L 33/62* (2010.01)

(52) U.S. Cl.
  CPC ............ *H01L 33/24* (2013.01); *H01L 33/325* (2013.01); *H01L 33/62* (2013.01)

(56) References Cited

U.S. PATENT DOCUMENTS

| | | |
|---|---|---|
| 2010/0224857 A1 | 9/2010 | Soh et al. |
| 2011/0186876 A1 | 8/2011 | Suzuki et al. |
| 2012/0077299 A1 | 3/2012 | Nishikawa et al. |
| 2012/0193689 A1 | 8/2012 | Park et al. |

FOREIGN PATENT DOCUMENTS

| | | |
|---|---|---|
| JP | 2003-332619 A | 11/2003 |
| JP | 2004-55742 A | 2/2004 |
| JP | 2005-72323 A | 3/2005 |
| JP | 2008-263127 A | 10/2008 |
| JP | 2008-277865 A | 11/2008 |
| JP | 2009-152297 A | 7/2009 |
| JP | 2011-501408 A | 1/2011 |
| JP | 2011-134854 A | 7/2011 |
| JP | 2011-159671 A | 8/2011 |
| JP | 2013-120848 A | 6/2013 |
| JP | 2013-122472 A | 6/2013 |
| JP | 2015-126209 A | 7/2015 |
| JP | 2017-208568 A | 11/2017 |
| WO | WO 2010/128643 A1 | 11/2010 |
| WO | WO 2012/127801 A1 | 9/2012 |

OTHER PUBLICATIONS

Mitchell et al., "Perspective: Toward Efficient GaN-based Red Light Emitting Diodes using Europium Doping," Journal of Applied Physics, vol. 123, 160901, 2018 (Published online: Mar. 29, 2018), pp. 180901-1 to 160901-12 (total 13 pages).

International Search Report for PCT/JP2019/047334 mailed on Mar. 10, 2020.

Written Opinion of the International Searching Authority for PCT/JP2019/047334 (PCT/ISA/237) mailed on Mar. 10, 2020.

* cited by examiner (a)

(b)

(c)

RGB Stripe method
(a)

Pentile method
(b)

(c)

(d)

DISPLAY DEVICE AND METHOD OF MANUFACTURING SAME

CROSS REFERENCE TO RELATED APPLICATIONS

This application is a Continuation of PCT International Application No. PCT/JP2019/047334, filed on Dec. 4, 2019, which claims priority under 35 U.S.C. 119(a) to Patent Application Nos. 2018-234965, filed in Japan on Dec. 14, 2018; and 2019-145022, filed in Japan on Aug. 7, 2019, all of which are hereby expressly incorporated by reference into the present application.

TECHNICAL FIELD

The present invention relates to a display device and a method for manufacturing the same, and more particularly to a display device such as a color display using a light emitting diode and a method for manufacturing the same.

BACKGROUND OF THE INVENTION

In recent years, a light emitting device configured by using a light emitting diode (LED: Light Emitting Diode) has been widely used as a display device. In particular, LEDs are widely used in various display devices, mobile phones, backlights of liquid crystal displays, white lighting, and the like.

Their application to microdisplays used in projectors and the like is particularly attracting attention.

The semiconductor element constituting the LED is mainly manufactured by using a nitride semiconductor substrate on which a nitride semiconductor thin film such as gallium nitride (GaN), aluminum nitride (AlN), or indium nitride (InN) is formed. Further, in order to increase the luminous efficiency, a multiple quantum well structure (MQW or MQWs) is usually used for forming the light emitting portion, and a PiN junction is used in which an intrinsic semiconductor layer as the activate layer is formed between a p-type semiconductor and an n-type semiconductor by using the multiple quantum well structure (for example, Patent Document 1).

Conventionally, in a display device made using an inorganic LED formed from the above-mentioned nitride semiconductor film, a plurality of LEDs in which the individual LEDs having different wavelengths, red (R), green (G), and blue (B), are arranged side by side on one substrate and a driver IC for controlling the color and brightness of each pixel as a display device are connected by wiring (for example, Patent Document 2). For this reason, it becomes a high-cost display device, and high-definition is not sufficient.

In particular, when a high-definition screen such as a display is required, the number of pixels must be increased. If the number of pixels is increased, the cost of the LED increases in proportion to the number of pixels, and at the same time, the cost of arranging the LEDs has also increased. Hence, the display device had to be high cost dramatically.

It is thought, for example, that it will be possible to solve the above problem by forming a structure in which R, G, and B color LEDs are arranged on the same semiconductor substrate and forming a large number of pixels in one process like an integrated circuit (LSI).

PRIOR ART DOCUMENTS

Patent Document

[Patent Document 1] JP2008-277865A
[Patent Document 2] JP2013-122472A

SUMMARY OF INVENTION

Problems to be Solved by the Invention

However, it was found that there are the following problems, when a display device is configured by using three types of LEDs, a conventional red LED, a green LED, and a blue LED.

That is, the conventional 3 LEDs of R, G and B are all formed by a type of GaN in which the active layer contains indium (In) (hereinafter, also referred to as "InGaN"), and the size of the band gap is adjusted by changing the content of In to realize light emission of R, G, and B. When these three-color LEDs are stacked to form a pixel, if the short wavelength green and blue LEDs are arranged below the red LED with respect to the light emitting direction, when the lights emitted by the green and blue LEDs irradiate the active layer of the red LED, the lights are absorbed by the active layer of the red LED and used for excitation. Therefore, it was found that the lights could not properly transmit the active layer of the red LED.

Thus, it is conceivable to arrange the red LED on the bottom layer. In this case, however, in the red LED represented by $In_xGa_{1-x}N$, the value of x must be about 0.35, and the ratio of In must be significantly higher than those of the green LED and the blue LED. Therefore, it is inevitable that the amount of the added element becomes too large, the crystals of the active layer are greatly degraded and the surface is roughened. When the green LED and the blue LED are stacked on such a red LED, since the crystals of the green LED and the blue LED grow by inheriting the rough surface of the red LED, large degradation occurs in the crystals and it was found that the light emission efficiency is lowered due to the deterioration of crystallinity.

Therefore, an object of the present invention is to provide a display device provided with a light emitting unit capable of emitting a plurality of types of light having different wavelengths to the outside with high strength at a desired ratio, which does not increase manufacturing cost in proportion to the number of pixels, even when the number of pixels increases.

Means for Solving the Problems

Under the above circumstances, the present inventor has developed the nitride semiconductor light emitting device having a nitride semiconductor, as an active layer, in which europium (Eu) is added to GaN, the first in the world, and has received a great deal of attention from engineers around the world. (For example, JP2013-12847A).

GaN: Eu is dramatically superior in light emitting function as a material for red LEDs, and is also extremely excellent in crystallinity. Therefore, by using GaN: Eu as a red LED and manufacturing it in one process on the same substrate as the blue LED and green LED in one reactor, it is expected to be possible to manufacture a display device that is extremely excellent in terms of performance and manufacturing cost.

However, as described above, the In-containing type green GaN and blue GaN have various problems and are positioned as materials that are not practical and difficult to commercialize.

Therefore, it has been considered necessary to develop green LEDs and blue LEDs that do not have the drawbacks of the In-containing type.

Under such circumstances, the present inventors have considered that, since GaN: Eu has a structure and properties that are basically different from those of the In-containing type GaN, there may be a possibility, although it is small, to compensate for the drawbacks of the In-containing type, on the contrary, and conducted various experiments.

That is, In-containing green GaN and blue GaN were stacked in various combinations on red GaN: Eu.

As a result, surprisingly, a display device having an excellent light emitting function was obtained.

Specifically, even when In-containing green and blue GaNs are arranged below the red GaN: Eu with respect to the emission direction, green light and blue light are emitted without being absorbed by the red GaN: Eu, not like the case of In-containing red GaN, and it was confirmed that they transmit the red LED without any problem.

In this way, contrary to the expectation of many engineers, the light of short wavelengths G and B could be extracted without being absorbed by the active layer of the red LED having a small bandgap. It is considered, as the reason, that, when the active layer was formed by GaN: Eu, the light emission mechanism is not based on the interband transition, but on the electronic transition of the electrons in the Eu ion in the 4f shell, that is, the f-f transition.

Further, even when green GaN and blue GaN are stacked on the red GaN: Eu on the lower side, since GaN: Eu does not have surface roughness, not like red In-containing GaN having a high In ratio, and has an extremely flat surface, it does not deteriorate the crystallinity of the In-containing type green GaN and blue GaN stacked on the upper side, and it was confirmed that both green GaN and blue GaN exhibit the light emitting function at the same level as when they are used alone.

Then, as described above, even when the red LED having GaN: Eu as the active layer is on the lower side and the green LED and the blue LED are stacked on the red LED, the surface of GaN: Eu is flat unlike the In-containing LED and the light emitting function of the stacked green LED and blue LED is not deteriorated. On the other hand, even when the green LED and blue LED are on the lower side and the red LED having GaN: Eu as the active layer is stacked on the green LED and the blue LED, the green light and blue light are not absorbed by the GaN: Eu active layer of the red LED and the light emission efficiency of the green LED and the blue LED does not decrease. Therefore, it was found that, when the three-color LEDs of R, G and B are stacked, the stacking order of the LEDs can be selected freely.

As described above, it has been found that an excellent display device can be realized by developing a red LED using GaN: Eu, but it is considered that the above is not limited to GaN: Eu.

Rare earth elements generally have the common property that splitting occurs at the 4f electron level due to the effects of spin-orbit interaction and crystal field, and it can be theoretically said that the mechanism of light emission due to the f-f transition as described above occurs not only in Eu but also in other rare earth elements.

Further, since the rare earth element is a lanthanoid having properties similar to each other, it is expected that not only Eu but also other rare earth elements do not roughen the crystals when added to GaN, and, as in the case of Eu, the stacking order of LEDs can be freely selected.

Further, in the above, GaN has been described as the nitride, but it can be said that a similar phenomenon occurs, basically, in so-called GaN-based nitrides such as AlN and InN (including mixed crystals of InGaN and AlGaN) other than GaN.

In the above description, the GaN: Eu is used as a red LED and the blue LED and the green LED are vertically stacked on the same substrate. However, it was found that even when the GaN: Eu is used as the red LED, the blue LED and the green LED are used and the LEDs are arranged side by side on the same substrate, an excellent display device can be manufactured as in the case of stacking the LEDs in the vertical direction. When stacking them in the vertical direction, the stacked LEDs grow by inheriting the surface state of the lower layer LED, so strict condition control is required for film formation, but when arranging them side by side, even if the control of the film formation conditions for the LEDs is slightly loosened, the effect of loosening is small, so that the manufacturing yield can be improved.

The present invention is based on the above description and the description of the embodiment described later, and the invention according to embodiment 1 is a display device wherein plurality type of PiN junction type light emitting diodes that emit light having different wavelengths from each other are arranged on the same substrate, and at least one of the plurality types of light emitting diodes includes a light emitting unit having an active layer containing a rare earth element, with a different mechanism of light emission from other light emitting diodes.

The invention according to embodiment 2 is the display device according to embodiment 1 characterized in that, the light emitting diode having the longest wavelength among the plurality types of light emitting diodes is a light emitting diode having an active layer containing the rare earth element, at least.

The invention according to embodiment 3 is the display device according to embodiment 1 or 2 characterized in that, the plurality types of light emitting diodes are composed of three types of light emitting diodes, a red diode, a green diode, and a blue diode, the substrate is a gallium nitride substrate, and the red diode has a gallium nitride-based (GaN-based) active layer containing europium (Eu) as the rare earth element.

The invention according to embodiment 4 is the display device according to any one of embodiments 1 to 3 characterized in that, the plurality types of light emitting diodes are sequentially stacked on the surface of the substrate, and are formed wherein, on at least a part of the light emitting layer corresponding to one color, a light emitting layer corresponding to another color is superimposed.

The invention according to embodiment 5 is the display device according to embodiment 4 characterized in that, the light emitting unit is stacked in the order of a red diode, a green diode, and a blue diode, or in the order of a red diode, a blue diode, and a green diode from the substrate side.

The invention according to embodiment 6 is the display device according to embodiment 5 characterized in that, the light emitting unit has a stepped structure in which a step is formed on the surface side to form an electrode for energizing the light emitting diode of each of the green diode and the blue diode.

The invention according to embodiment 7 is the display device according to embodiment 6 characterized in that, the recess formed by the step is filled with an insulator and the surface of the light emitting unit is flattened.

The invention according to embodiment 8 is the display device according to any one of embodiments 4-7 characterized in that, a barrier layer formed of any of AlN, AlGaN, AlInN, and AlGaInN is provided at the interface between the red diode and the green diode and at the interface between the green diode and the blue diode, when the light emitting unit is stacked in the order of the red diode, the green diode and the blue diode from the substrate side, or at the interface between the red diode and the blue diode and at the interface between the blue diode and the green diode, when the light emitting unit is stacked in the order of the red diode, the blue diode, and the green diode from the substrate side.

The invention according to embodiment 9 is the display device according to any one of embodiments 4-8 characterized in that, a DBR structure in which AlInN and GaN are stacked, AlGaN and GaN are stacked, or AlGaInN and GaN are stacked is formed
- at the interface between the red diode and the green diode and at the interface between the green diode and the blue diode, when the light emitting unit is stacked in the order of the red diode, the green diode and the blue diode from the substrate side, or
- at the interface between the red diode and the blue diode and at the interface between the blue diode and the green diode, when the light emitting unit is stacked in the order of the red diode, the blue diode, and the green diode from the substrate side.

The invention according to embodiment 10 is the display device according to any one of embodiments 1-3 characterized in that, wherein the plurality types of light emitting diodes are arranged side by side on the surface of the substrate.

The invention according to embodiment 11 is the display device according to embodiment 10 characterized in that, the plurality types of light emitting diodes are composed of three types of light emitting diodes, a red diode, a green diode, and a blue diode.

The invention according to embodiment 12 is the display device according to embodiment 10 or 11 characterized in that, the gap between the plurality types of light emitting diodes is filled with an insulator and the surface of the light emitting unit is flattened.

The invention according to embodiment 13 is the display device according to embodiment 12 characterized in that, the insulator is made of any of a visible light permeable resin material, a visible light opaque resin material, and a resin material that reflects visible light.

The invention according to embodiment 14 is the display device according to any one of embodiments 1-13 characterized in that, a multi-layer wiring structure for forming an electric circuit is formed on the surface of the light emitting unit, and the multi-layer wiring structure includes at least one active element.

The invention according to embodiment 15 is the display device according to any one of embodiments 1-13 characterized in that, a multi-layer wiring structure for forming an electric circuit is formed on the surface of the light emitting unit, and the multi-layer wiring structure is a passive matrix type structure that does not include an active element.

The invention according to embodiment 16 is the display device according to any one of embodiments 5-9 or to embodiment 11 characterized in that, the blue diode, the green diode, and the red diode are arranged in a pentile shape.

The invention according to embodiment 17 is a method for manufacturing a display device according to any one of embodiments 1-16 characterized in that, the light emitting unit of the plurality types of light emitting diodes is formed by using a metalorganic vapor phase growth method.

Effect of the Invention

According to the present invention, even when the number of pixels is increased, the manufacturing cost does not increase in proportion to the number of pixels, and a display device is provided which has a light emitting unit capable of emitting plurality types of light having different wavelengths to the outside at an intensified strength at a desired ratio.

EMBODIMENTS OF CARRYING OUT THE INVENTION

Hereinafter, the present invention will be described with reference to the drawings based on the embodiments of carrying out the invention.

The display device of the present invention differs from a display device using a conventional LED in that; it has a structure in which a plurality of LEDs that emit a plurality types of light having different wavelengths are arranged on the same semiconductor substrate, and at least one type of the plurality types of light emitting diodes has a light emitting unit using an LED having an active layer containing a rare earth element.

As the structure of the light emitting unit, there are two types; a vertical integration type in which a plurality types of LEDs are stacked each type one by one to form pixels on the same semiconductor substrate, and a horizontal integration type in which they are arranged side by side in a plane to form pixels. Hereinafter, the formation process of the light emitting unit where the pixels are formed using three-color LEDs of R, G, and B will be described in the order of the vertical integration type and the horizontal integration type. In the following description, sapphire is taken as an example of a substrate and GaN is taken as an example of the nitride constituting a semiconductor substrate and a nitride semiconductor of an LED, but, as described above, the above description is not limited to these. For example, an nitride other than so-called GaN-based nitrides (including mixed crystals of InGaN and AlGaN), such as AlN and InN other than GaN-based, are also included.

[1] Vertical Integration Type
A. Configuration of Light Emitting Unit

Figure 1:
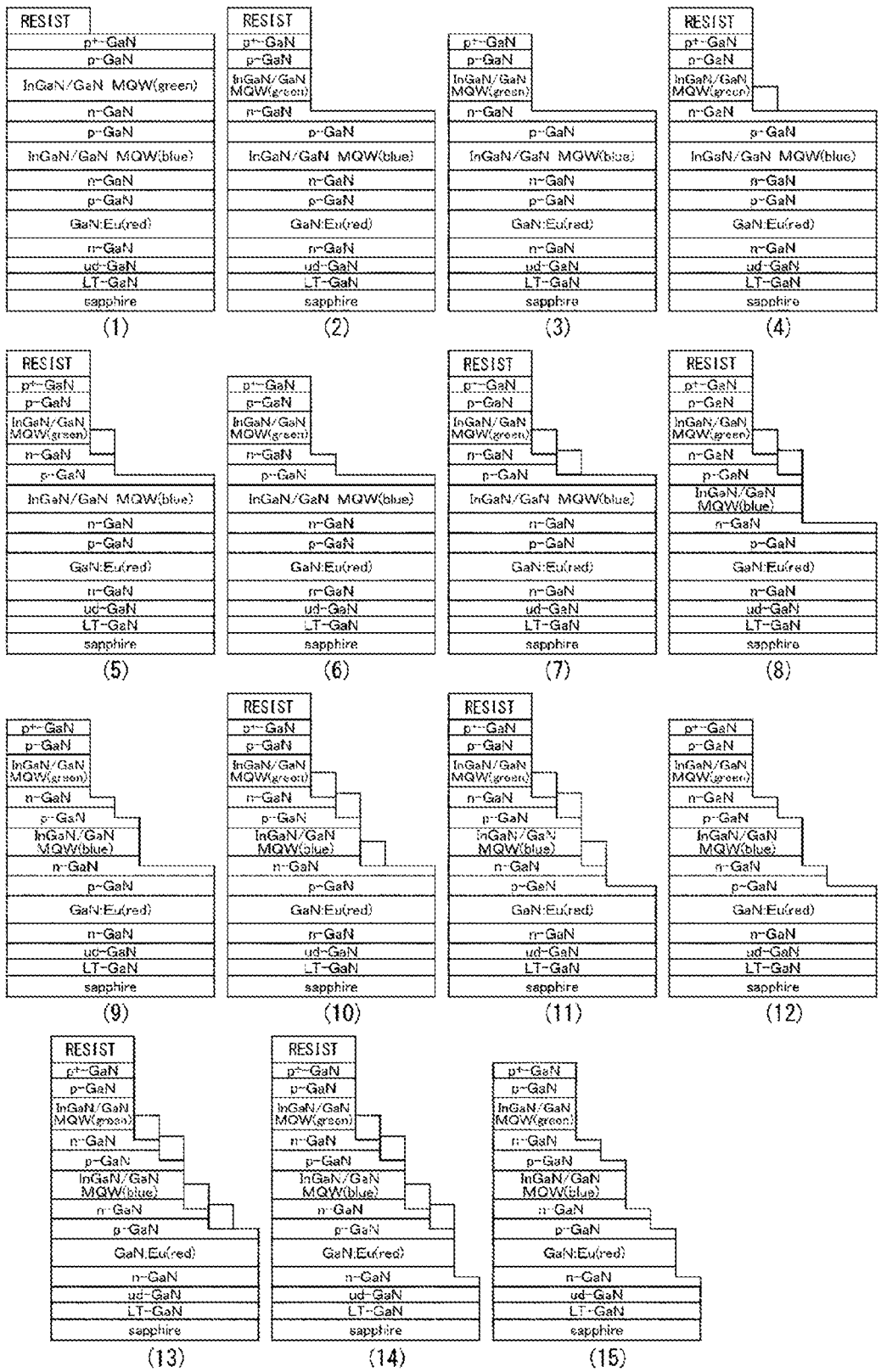
FIG. 1 A schematic diagram showing the film formation process of the light emitting unit of the display device according to one embodiment of this invention.

FIG. 1 is a schematic view showing a formation process of a light emitting unit of a vertical integration type. In FIG. 1, (12) is a diagram showing a state after stacking three-color LEDs. On a sapphire substrate, a buffer layer made of low-temperature GaN (LT-GaN), and a semiconductor substrate composed of an undoped GaN (u-GaN) layer, that is stacked on the buffer layer and provided to enhance the crystallinity of n-GaN are provided. On the semiconductor substrate, a red LED, a blue LED, and a green LED are stacked in this order from the substrate side.

Here, an example of stacking the red LED, the blue LED, and the green LED in this order from the substrate side is shown. This arrangement is desirable from the viewpoint of crystallinity and surface flatness, and is desirable from the viewpoint of ease of stacking.

On the other hand, the stacking order of the blue LED and the green LED is not limited to this, and the red LED, the green LED, and the blue LED may be arranged in this order. With such an arrangement, it becomes easier to increase the light emitting area of the green LED, which is less efficient than the blue LED, and it becomes easier to obtain the green light emitting intensity. Therefore, when emphasizing the viewpoint of crystallinity and surface flatness, the preferred order is red LED, blue LED and green LED, and for obtaining stronger green light emission, the preferred order is red LED, green LED and blue LED. In the case of ordering the red LED, the green LED and the blue LED, the manufacturing process is sufficient by replacing the process for green LED and the process for blue LED in the step structure formation shown below.

Each LED is composed of a PiN junction in which n-GaN, an active layer, and p-GaN are stacked from the substrate side, and each active layer (i layer) is formed of GaN/Eu and InGaN/GaN.

B. Formation of Light Emitting Unit
1. Formation of Substrate

First, a low-temperature GaN layer is grown as a buffer layer (for example, at 475° C.) on a sapphire substrate, and then an undoped GaN layer (for example, at 1180° C.) is grown for about 0.5 to 5.0 μm.

2. Red LED Formation

A red LED structure having a GaN: Eu layer as a light emitting layer is produced by an organometallic vapor phase epitaxy (OMVPE) method. Specifically, an n-type GaN layer to which Si is added is grown on the undoped GaN layer by about 0.1 to 5.0 μm (for example, at 1180° C.). At this time, the Si concentration is controlled to about $10^{17}$ to $10^{22}/cm^3$. As the Si source, a raw material containing Si such as monomethylsilane ($CH_3SiH_3$) and trimethylsilane (($CH_3)_3SiH$) is supplied to the sample surface in the form of a gas.

A GaN: Eu layer to which Eu is added is grown on the above layer by about 0.1 to 5.0 μm (for example, at 960° C.). At this time, the Eu concentration is controlled to be about $10^{17}$ to $10^{22}/cm^3$. Bis(n-propyl tetramethylcyclopentadienyl)europium ($EuCp_{pm2}$), $Eu(DPM)_3$, and the like are used as the Eu raw material.

A p-type GaN layer (or p-type AlGaN layer) to which Mg is added is grown on the above layer by about 0.1 to 5000 nm (for example, at 1050° C.). At this time, the Mg concentration is controlled to be about $10^{17}$ to $10^{22}/cm^3$. As the Mg source, for example, a raw material containing Mg such as $MgC_{p2}$ is supplied to the sample surface in the form of a gas.

3. Blue LED Formation

On the sample surface prepared above, a blue LED structure having an InGaN layer as a light emitting layer is produced by an organometallic vapor phase epitaxy method.

Specifically, an n-type GaN layer to which Si is added is grown on the above layer by about 0.1 to 5.0 μm (for example, at 1180° C.). At this time, the Si concentration is controlled to about $10^{17}$ to $10^{22}/cm^3$. As the Si source, a raw material containing Si such as monomethylsilane ($CH_3SiH_3$) and trimethylsilane (($CH_3)_3SiH$) is supplied to the sample surface in the form of a gas.

An InGaN quantum well structure is grown on the above layer by about 1 to 1000 nm (for example, at 715° C.). At this time, the InN mole fraction is controlled to be about 0.1 to 15%. Trimethylindium (TMIn) or the like is used as the In raw material.

A p-type GaN layer (or p-type AlGaN layer) to which Mg is added is grown on the above layer by about 0.1 to 5000 nm (for example, at 1050° C.). At this time, the Mg concentration is controlled to be about $10^{17}$ to $10^{22}$ cm/$^3$. As the Mg source, for example, a raw material containing Mg such as MgCp$_2$ is supplied to the sample surface in the form of a gas.

4. Green LED Formation

On the sample surface prepared above, a green LED structure having an InGaN layer as a light emitting layer is produced by an organometallic vapor phase epitaxy method.

Technically, an n-type GaN layer to which Si is added is grown on the above layer by about 0.1 to 5.0 μm (for example, at 1180° C.). At this time, the Si concentration is controlled to about $10^{17}$ to $10^{22}$/cm$^3$. As the Si source, a raw material containing Si such as monomethylsilane (CH$_3$SiH$_3$) and trimethylsilane ((CH$_3$)$_3$SiH) is supplied to the sample surface in the form of a gas.

An InGaN quantum well structure is grown on the above layer by about 1 to 1000 nm (for example, at 675° C.). At this time, the InN mole fraction is controlled to be about 15 to 40%. Trimethylindium (TMIn) or the like is used as the In raw material.

A p-type GaN layer (or p-type AlGaN layer) to which Mg is added is grown on the above layer by about 0.1 to 5000 nm (for example, at 1050° C.). At this time, the Mg concentration is adjusted to be about $10^{17}$ to $10^{22}$/cm$^3$. A raw material containing Mg such as MgCp$_2$ as an Mg source is supplied to the sample surface in the form of a gas.

As described above, the stacked body shown in (1) is formed.

5. Step Structure Formation

As described above, the stacked body shown in (1) of FIG. 1 is formed. Next, in order to form the n-electrode for the red LED and the n-electrode and the p-electrode for the blue LED and the green LED, the stacked body is made a stepped structure so that the area of the red LED>the area of the blue LED>the area of the green LED. At this time, the ratio of the light emitting areas of the green LED, the blue LED and the red LED is adjusted so that a high-quality white color is obtained when all three colors of R, G and B are made to emit light. The area ratio is determined based on the external quantum efficiency of each LED and the human clear vision standard luminous efficiency.

However, the adjustment method here is not limited to the case of adjusting only by the area ratio. The amount of light emission from an LED can be changed not only by the light emitting area but also by the voltage applied to the light emitting element (the higher the voltage is applied, the stronger the light is emitted) and the current (the larger the current is applied, the stronger the light is emitted). Therefore, even if the target light emission amount cannot be reached in terms of the area ratio, by applying a higher voltage and/or larger current to the LED of that color than the LEDs of other colors, the light emission becomes stronger and, as a result, it may be adjusted to the target light emission amount.

Etching is used to form the stepped structure, which is performed by the following process. The numbers below correspond to the numbers in FIG. 1. The following steps are for a case in the order of red LED, blue LED, and green LED from the bottom.

(1) Patterning of resist for lower area of green LED
(2) Dry etching to n layer of green LED
(3) Resist peeling
(4) Patterning of resist for upper electrode area of blue LED
(5) Dry etching to p layer of blue LED
(6) Resist peeling
(7) Patterning of resist for lower electrode area of blue LED
(8) Dry etching to n layers of blue LED
(9) Resist peeling
(10) Patterning of resist for upper electrode area of red LED
(11) Dry etching to the p layer of Red LED
(12) Resist peeling
(13) Patterning of resist for lower electrode area of red LED
(14) Dry etching to the n layer of red LED
(15) Resist peeling The process flow for producing the above stepped structure is just an example, and is not limited to the above if there are other approaches such as regrowth, selective growth, and substrate bonding technology.

Figure 2:
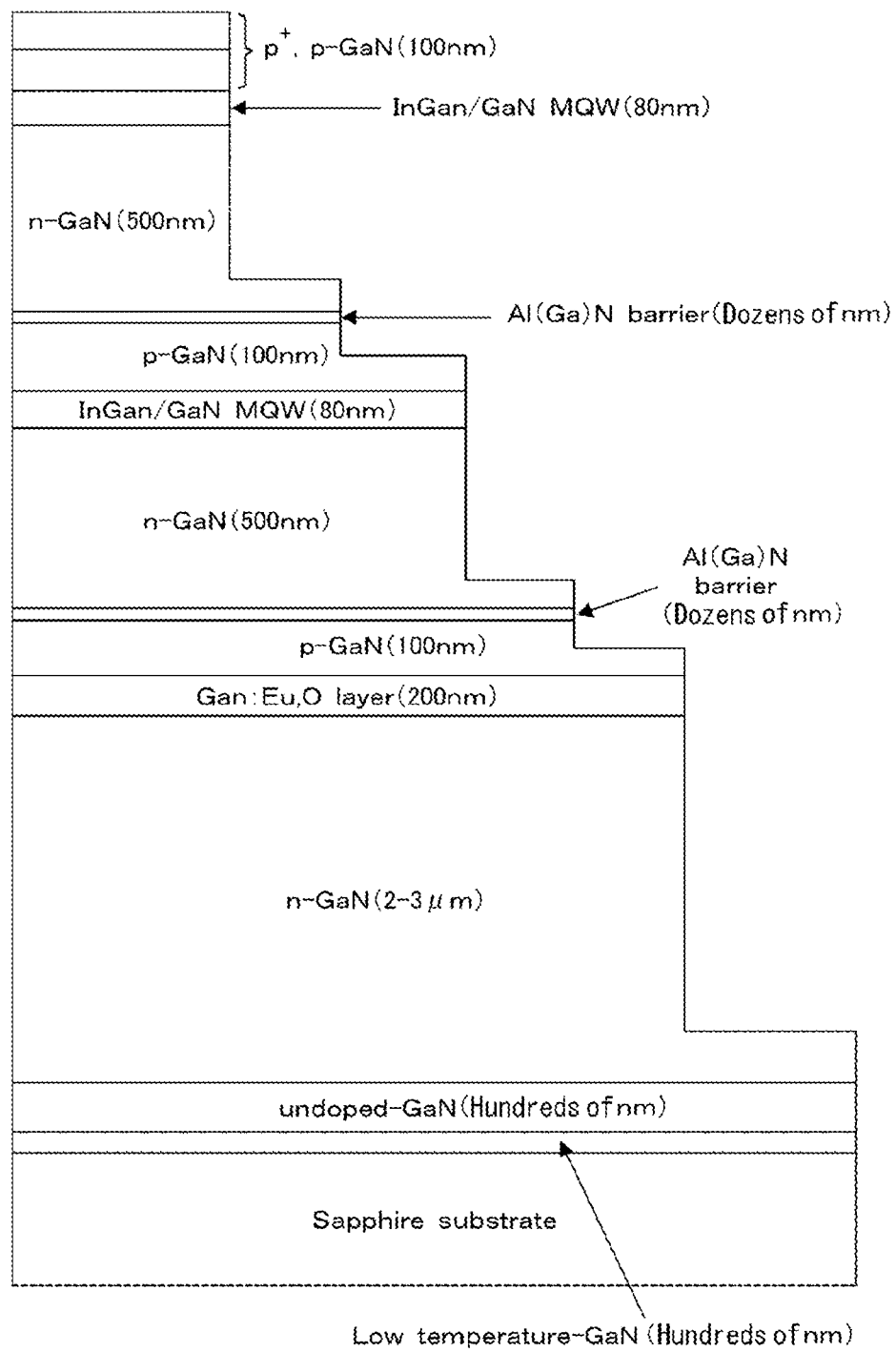
FIG. 2 A schematic diagram showing the cross-sectional structure after making the step structure of the light emitting unit of a three-color LEDs vertical integration type.

FIG. 2 shows a cross-sectional structure of the vertical integration type light emitting unit after a stepped structure was made. The thickness of each layer shown in FIG. 2 is an example and is not limited. In FIG. 2, unlike FIG. 1, an AlGaN barrier layer is formed between each of the green, blue, and red LEDs. This takes into account that it is preferable that terminals of the p-GaN and the n-GaN in the upper part are electrically insulated from each other, when the electrodes are actually attached. The barrier layer is not limited to the AlGaN layer, and may be any barrier layer of AlN, AlInN and AlGaInN.

Figure 3:
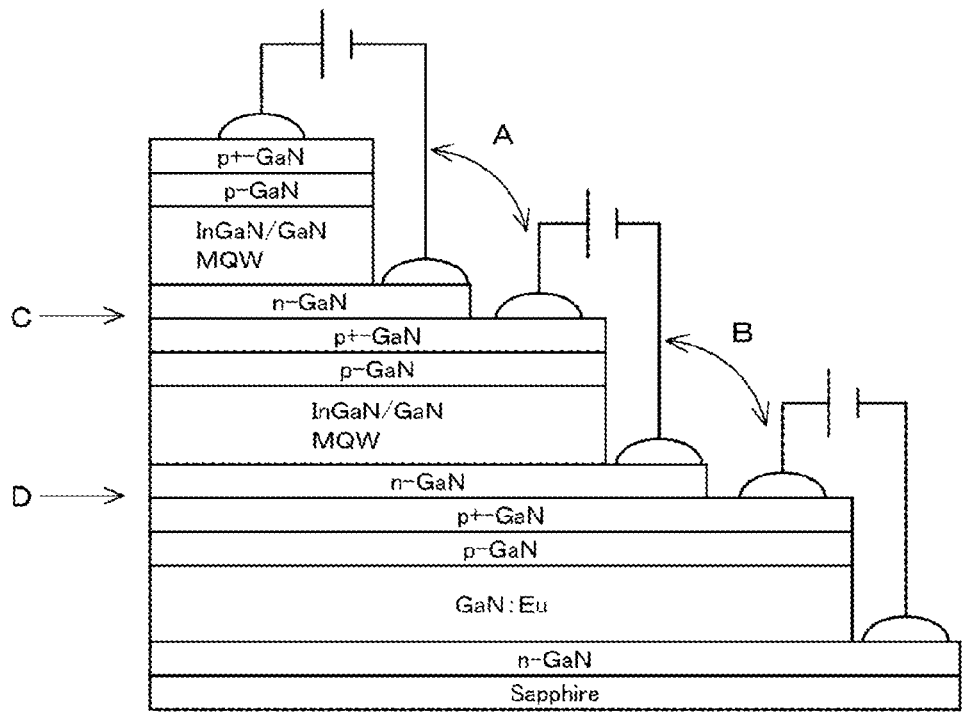
FIG. 3 A figure explaining the barrier layer in the display device according to this invention.

That is, as shown in FIG. 3, when the n-GaN and p+-GaN of each LED are connected, a parasitize pn junction may be formed and a leak current may occur between the electrodes of the adjacent LEDs (p+-GaN in the lower part/n-GaN in the upper part), A and B. In order to suppress the occurrence of such a leak current, it is preferable that barrier layers such as AlGaN are provided between p+-GaN in the lower part and n-GaN in the upper part, C and D, and the terminals are electrically insulated from each other. The specific thickness of the barrier layer is preferably about 1 nm to 1 μm (for example, 50 nm).

Figure 4:
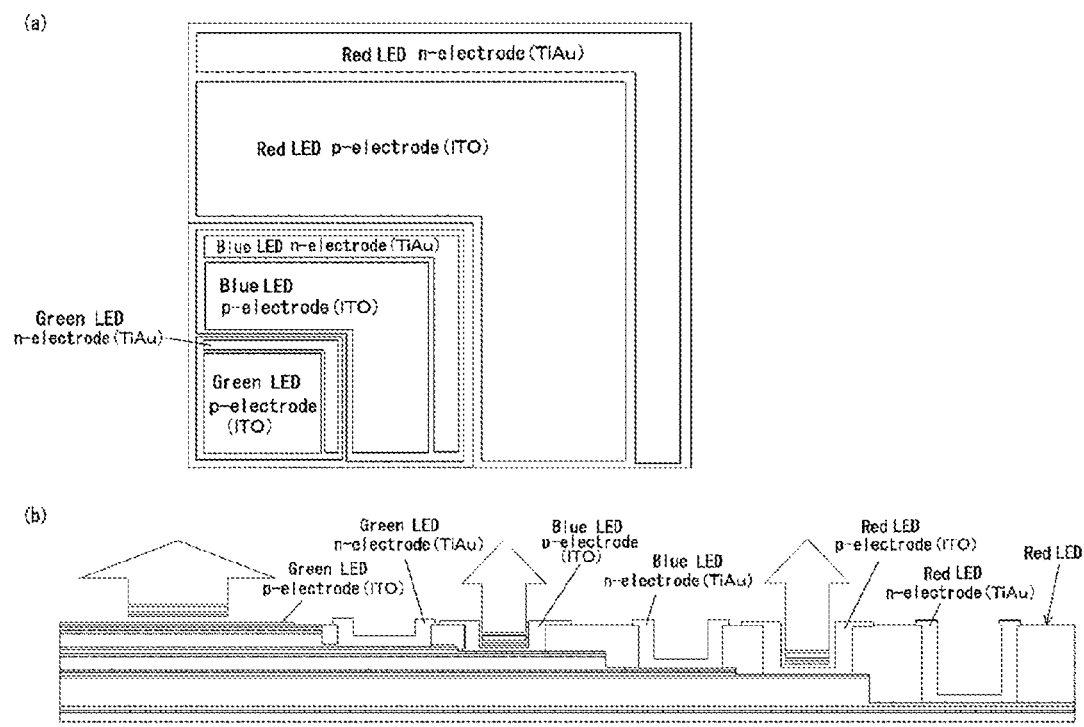
FIG. 4 A figure showing the form after forming the electrode of the light emitting unit of a three-color LEDs vertical integration type, (a) is a schematic view seen from the upper side, and (b) is a schematic view of a cross section.

Further, FIG. 4 shows an example of the form after forming the electrodes of the vertical integration type light emitting unit. Note that (a) is a schematic view seen from above, and (b) is a schematic view of a cross section. The area ratio of the blue LED, the green LED, and the red LED excluding the electrode-forming portion is set to, for example, 1:1:6. The thickness of one chip is 10 μm or less.

In FIG. 4, the step for taking out the electrode is formed in an "L shape" viewed from above (planarly) so as to cut out two sides of the square member, but the form of step is not limited to the above. For example, it may be cut out in a "strip shape" by cutting out only one side of a square member, or it may be cut out in a "gate stance shape" by cutting out three sides of a square member. Alternatively, the cutouts of one side, two sides and three sides may be mixed to form a step.

C. Electrode Formation

1. Upper Take-Out Type

Figure 5:
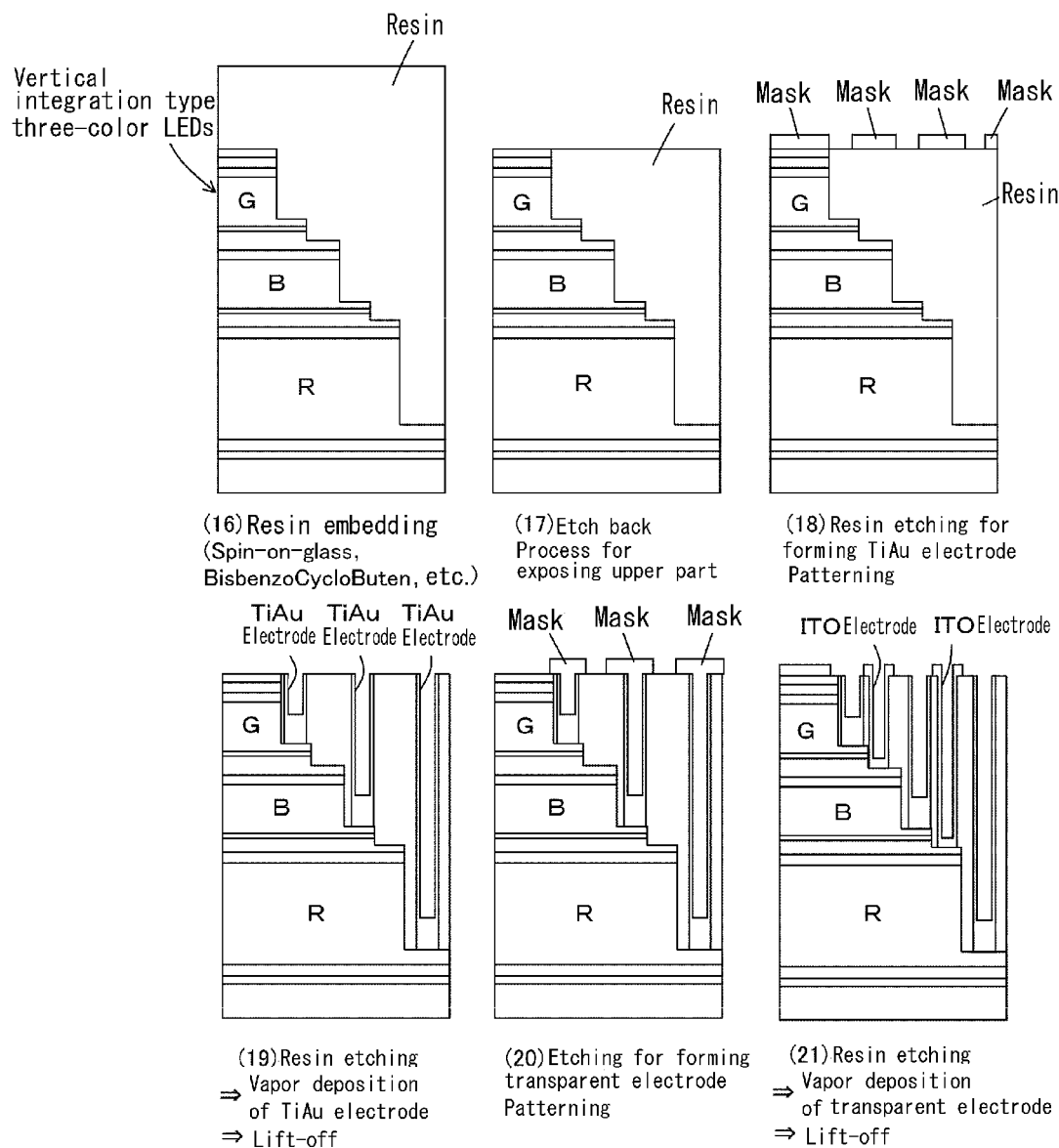
FIG. 5 A figure explaining the formation process of an upper take-out type electrode of the three-color LEDs vertical integration type.

Upper take-out type, i.e. the type where the light is taken out from the green LED side, the electrode is formed by the following process. The numbers below correspond to the numbers in FIG. 5.

(16) Embed and flatten the structure of (15) in FIG. 1 using a resin such as spin-on glass, bisbenzocyclobutene, or polydimethylsiloxane, which is initially liquid but solidifies by a chemical reaction due to heat or exposure. As the condition of the resin, one having transparency to visible light (RGB) (one having no absorption in the visible light region or one having little absorption) is used. The above-mentioned materials have no or little absorption with respect to visible light.

Those which satisfy the above-mentioned conditions are also included in the resin. If light diffuses and leaks from the pixel side wall to the adjacent pixel, interference may occur between the adjacent pixels and the image may be blurred. In such a case, it is preferable to use a resin material opaque to visible light to absorb visible light as the above resin.

(17) Etching until the upper part of the p-GaN of the red LED is exposed by dry etching of the resin (called etch back).

(18) Patterning for forming electrodes on the n layers of the green, blue, and red LEDs.

(19) Resin Etching (dry etching or wet etching)→n-type electrode formation (material that can make ohmic contact with normal n-GaN. For example, TiAu: titanium/gold)→electrode lift-off process by resist peeling.

(20) Patterning for forming transparent electrodes on the p-layer of green/blue/red LEDs.

(21) Resin etching (dry etching or wet etching)→p-type electrode formation (ITO: indium, tin, lead)→Lift-off process for transparent electrodes by resist peeling.

2. Lower Take-Out Type

Figure 6:
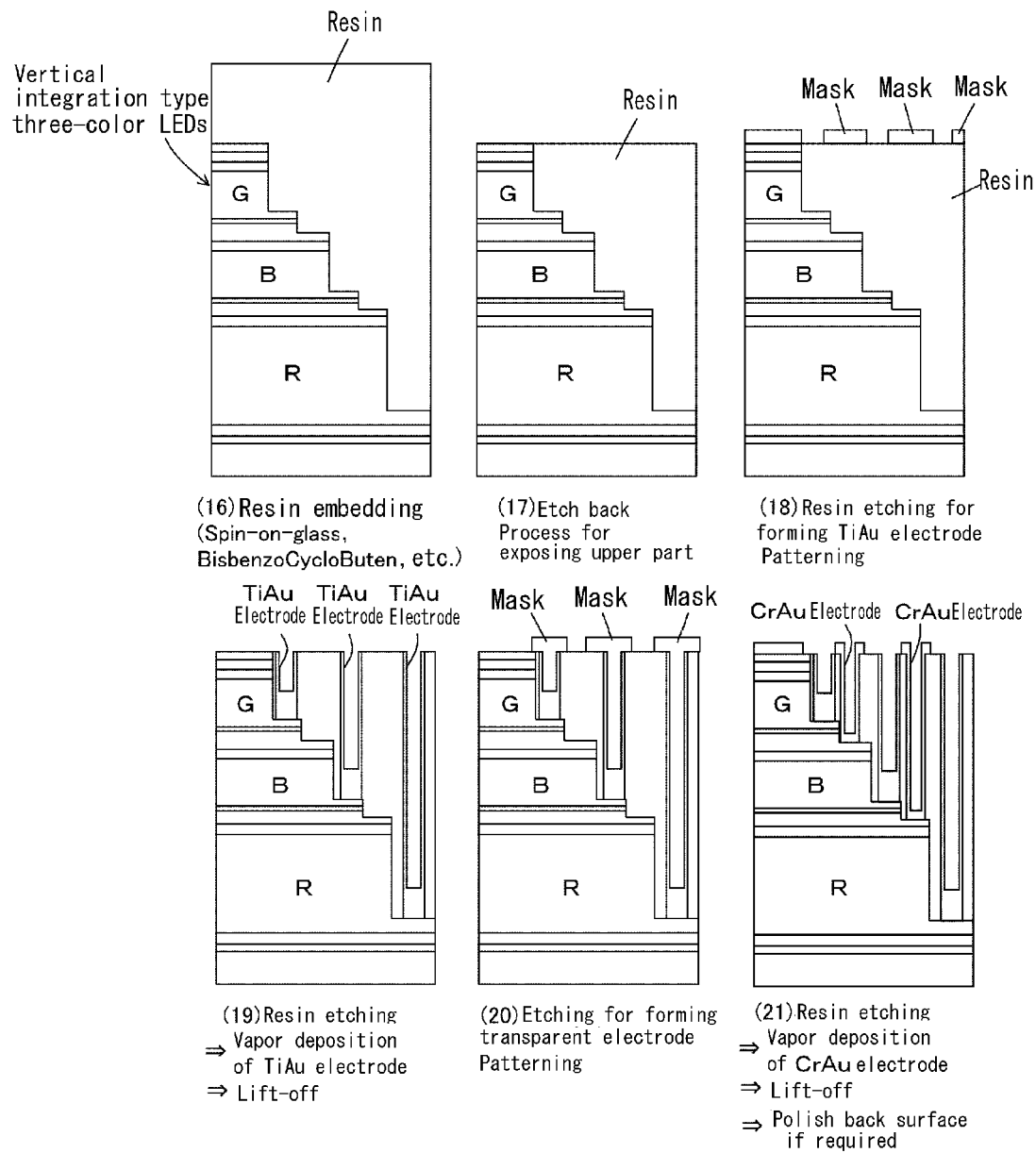
FIG. 6 A figure explaining the formation process of a lower take-out type electrode of the three-color LEDs vertical integration type.

Lower take-out type, i.e. the type where the light is taken out from the substrate side, the electrode is formed by the following process. The numbers below correspond to the numbers in FIG. 6. Basically, the same process as the upper take-out type is used, except that a metal electrode is used instead of the transparent electrode as the p-side contact electrode because it is not necessary to extract light upward.

(16) Embed and flatten the structure of (15) in FIG. 1 using an insulating resin such as spin on glass, bisbenzocyclobutene, or polydimethylsiloxane, which is initially liquid but solidifies by a chemical reaction due to heat, exposure or the like. As the condition of the resin, one having transparency to visible light (RGB) (one having no absorption in the visible light region or one having little absorption) or one reflecting visible light is used. If light diffuses and leaks from the pixel side wall to the adjacent pixel, as in the case of the upper take-out type interference may occur between the adjacent pixels and the image may be blurred. In such a case, it is preferable to use a resin material opaque to visible light to absorb visible light as the above resin.

(17) Etching back until the upper part of the p-GaN of the red LED is exposed by dry etching of the resin.

(18) Patterning for forming electrodes on the n layers of the green, blue and red LEDs.

(19) Etching of the resin (Dry etching or wet etching)→ n-type electrode formation (material that can make ohmic contact with normal n-GaN. For example TiAu: titanium/gold)→electrode lift-off process by resist peeling.

(20) Patterning for forming electrodes on the p layer of green/blue/red LEDs.

(21) Resin etching (dry etching or wet etching)→p-type electrode formation (material that can make ohmic contact with ordinary p-GaN. For example, CrAu: Chromium/Gold)→Lift off process of metal electrode by resist peeling.

Figure 7:
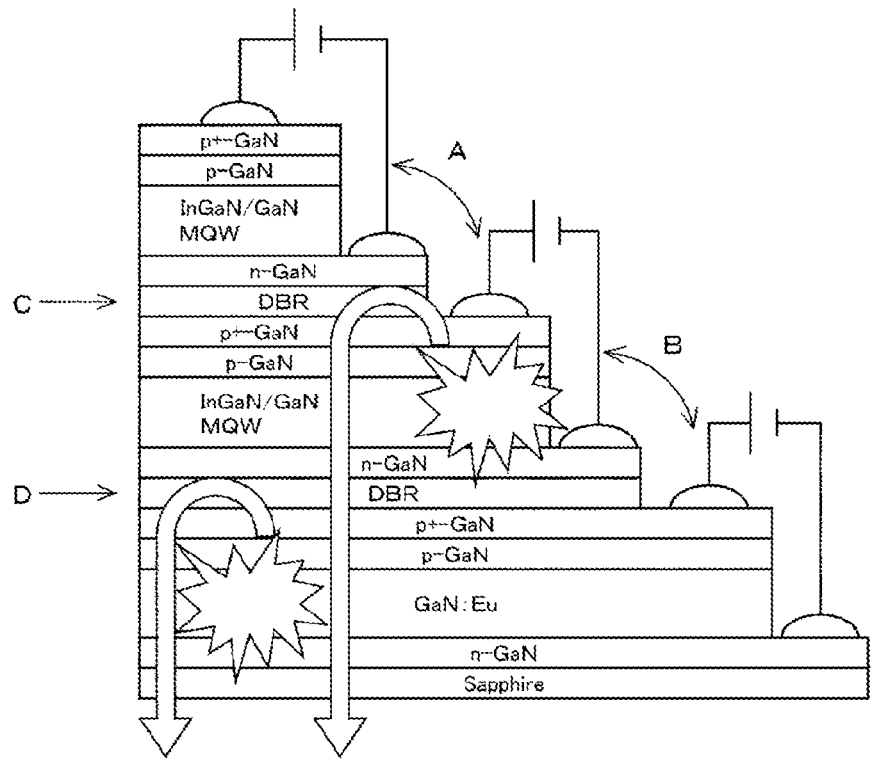
FIG. 7 A figure explaining the DBR structure in the display device according to this invention.
Figure 7:
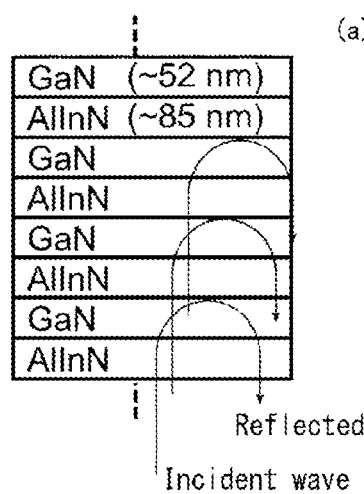
Figure 7:
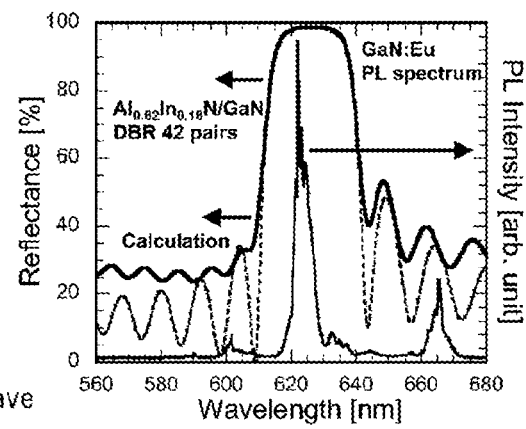

In the case of the vertical integration type and the lower take-off type, as shown in FIG. 7(*a*), by providing a DBR structure (diffraction grating) reflecting only a specific wavelength, by adding to or exchanging with the barrier layer described above, to reflect the light emitted toward the back surface side and send it out toward the front surface side, the light extraction efficiency to the outside can be further improved.

As a specific example, when a red LED, a blue LED, and a green LED are formed in order from the main surface side of the sapphire substrate in order to extract light downward (toward the sapphire substrate), a DBR structure that reflects red light or blue light is provided, by adding to or exchanging with the barrier layer, (D) between the top layer p-GaN layer that constitutes the red LED and the bottom layer n-GaN that constitutes the blue LED, and (C) between the top layer p-GaN layer that constitutes the blue LED and the bottom layer n-GaN that constitutes the green LED.

As a result, each of the red light and the blue light is reflected by the barrier layer and the DBR structure and sent out in the downward direction (toward the sapphire substrate), so that the amount of light sent out increases and the efficiency of light extraction to the outside is improved.

That is, in the DBR structure, light can be interfered and reflected by alternately growing and stacking media having different refractive indexes, and the light emission direction can be easily controlled. Then, in this way, the DBR structure acts as a diffraction grating, so that only light having a specific wavelength is reflected in the direction of returning to the active layer, and other light is transmitted. As a result, the amount of light sent out can be increased, and the light extraction efficiency can be improved.

As a specific DBR structure, for example, as shown in FIG. 7(*b*), a multilayer stacked film of AlInN (high refractive index)/GaN (low refractive index) is preferable. At this time, each layer is grown so that the occurrence of in-plane strain is controlled with sufficient lattice alignment between AlInN and GaN. The thickness and the number of layers of each layer are appropriately determined according to the wavelength of the target light. Usually 10 to 30 pairs are preferably stacked, but more than 100 pairs may be stacked. Such a DBR structure is not limited to stacking of AlInN/GaN, and may be a multilayer stacked film of AlGaN/GaN or AlGaInN/GaN. As shown in FIG. 7 (*c*), the present inventors have confirmed that a reflectance of 99.1% can be obtained by using AlInN (52 nm)/GaN (85 nm) as one pair and stacking 42 pairs as a DBR structure that reflects red (wavelength 626 nm). Such a stacked structure can be obtained, for example, by repeating the growth of AlInN at 820° C. and GaN at 1030° C.

Further, when light is extracted toward the surface of the sapphire substrate, even when the main surface of the sapphire substrate is subjected to uneven processing to form fine unevenness on the outermost surface, the unevenness makes the amount of light sent out from the main surface of the sapphire substrate increase, and the efficiency of extracting light to the outside can be improved. This uneven processing may be used in combination with the barrier layer and the DBR structure described above.

Figure 8:
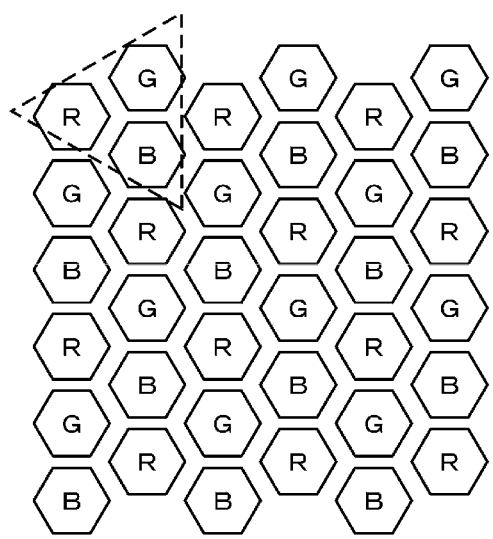
FIG. 8 A figure showing an arrangement example of the light emitting unit in the display device according to this invention.
Figure 8:
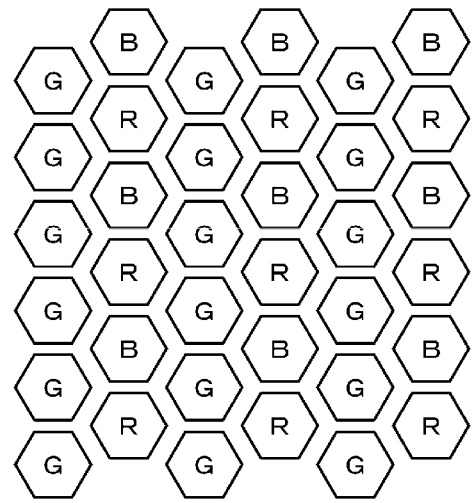

FIG. 8 shows another example of the form after forming the electrodes of the vertical integration type light emitting unit. As the configuration of the sub-pixels, as shown in FIG. 8(*a*), a RGB stripe method can be used, but a pentile method may also be adopted in which only green exists in each pixel and blue and red are spatially alternated as shown in FIG. 8(*b*). Then, by adopting such a pentile method, the apparent resolution can be increased even when the number of pixels is the same.

Further, the shape of the sub-pixels is not limited to the rectangle as shown in FIGS. 8 (*a*) and 8 (*b*). The sub-pixels may be arranged in a honeycomb shape based on a hexagon, for example, and, same as in the case of the pentile method, the apparent resolution can be increased even if the number of pixels is the same. As an example of such a honeycomb-like arrangement, FIG. 8(*c*) shows an example in which one pixel is composed of three RGB sub-pixels, and FIG. 8(d) shows an example in which one pixel is configured by the pentile method. It should be noted that this hexagonal pixel arrangement can also be applied to a horizontally integrated structure described later.

Further, when laying out a plurality of light emitting units, in addition to the case of laying out as they are in the vertical and horizontal directions, the layout may be performed while being line-symmetrical in the vertical and horizontal directions. As will be described later, since each light emitting unit is electrically connected to the transistor which is the driving element, it is desirable that the light emitting unit is arranged according to the layout arrangement of the transistor. Therefore, when a plurality of transistors is arranged so as to be line-symmetrical in the vertical and horizontal directions, it is preferable that the light emitting unit is also arranged in line symmetry in the vertical and horizontal directions. Further, when a plurality of transistors is arranged so that only the vertical relationship is line-symmetrical, or only the horizontal relationship is line-symmetrical, the light emitting unit may also be arranged in line-symmetry only in the vertical relationship, or only in horizontal relationship.

[2] Horizontal Integration Type

A. Configuration of the Light Emitting Unit

Figure 9:
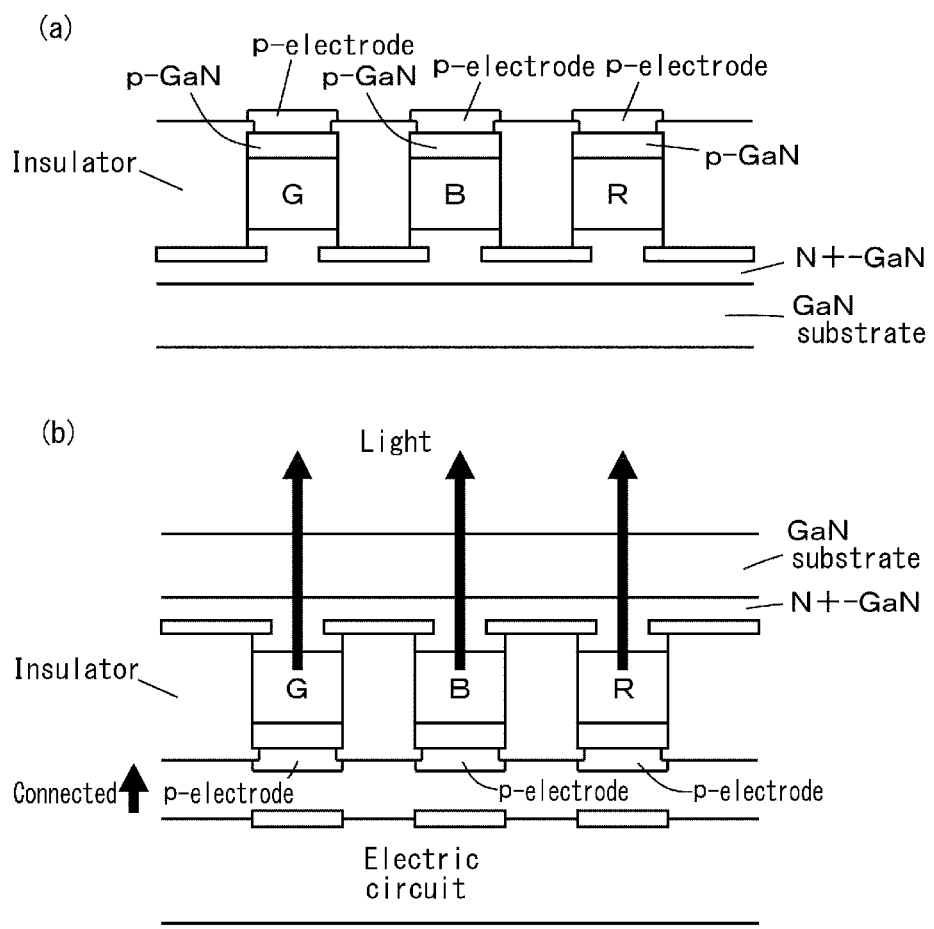
FIG. 9 A schematic diagram showing the structure of the light emitting unit of the display device according to another embodiment of this invention, and an example of the connection method of a light emitting unit and an electric circuit board.

FIG. 9 is a schematic view showing the configuration of the light emitting unit of the display device according to another embodiment of the present invention and the connection between the light emitting unit and the electric circuit board, and an example of the configuration of a horizontal integration type of three-color LEDs. As shown in FIG. 9(a), LEDs of three colors R, G, and B are integrated side by side on the same GaN substrate, and an insulator such as resin is embedded in the gap between the LEDs. Further, the R, G, and B color LEDs are arranged so that the n-electrodes are shared and the p-electrodes and the n-electrodes face in the same direction. In addition, the heights of the p-electrodes are the same. As shown in FIG. 9(b), the light-emitting unit may be turned upside down and face-down, so that the p-electrodes of each LED can be connected in one process to the electric circuit board which controls the light emission from three-color LEDs.

Figure 10:
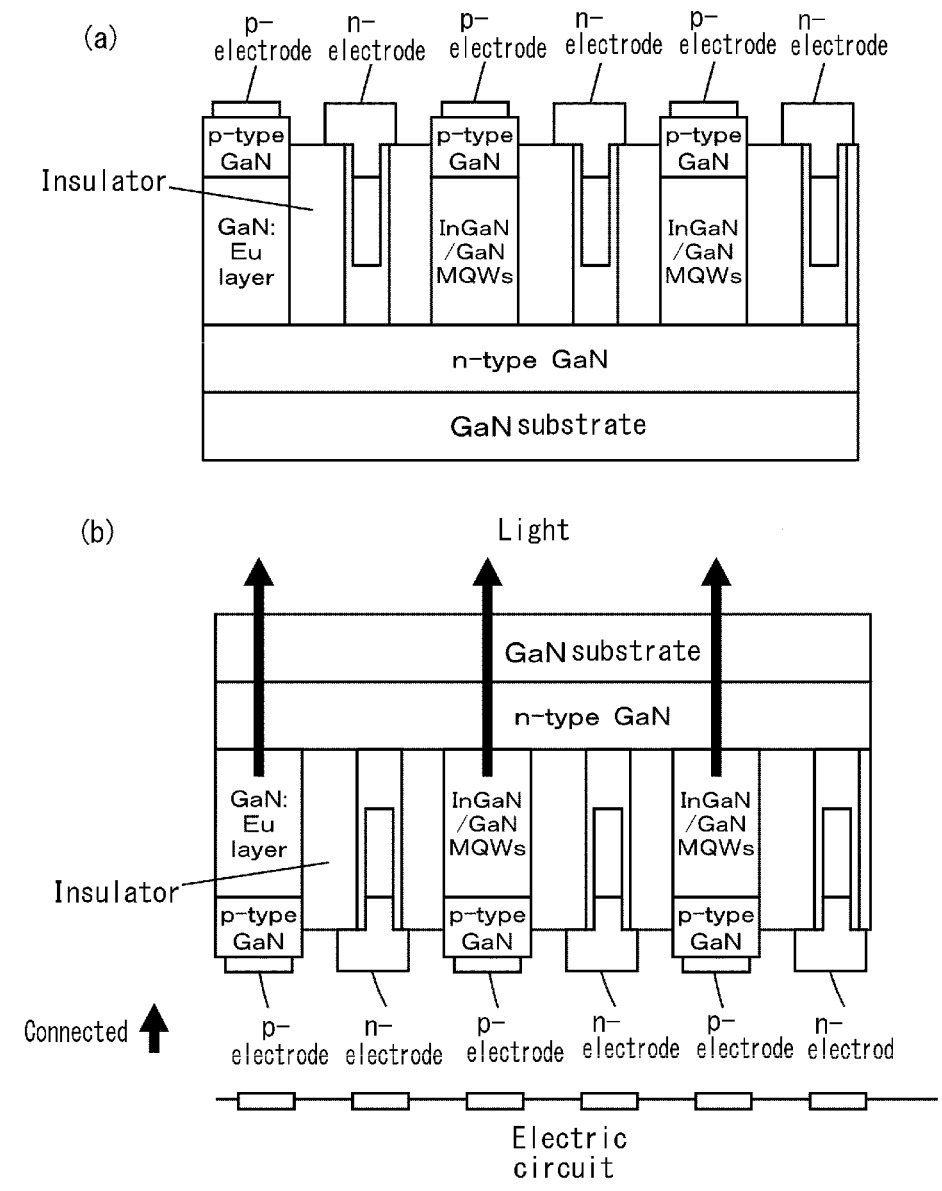
FIG. 10 A schematic diagram showing the structure of the light emitting unit of the display device according to another embodiment of this invention, and another example of the connection method of a light emitting unit and an electric circuit board.

Further, the light emitting unit can be configured as shown in FIG. 10(a). That is, the n-electrode is arranged on the same surface as the p-electrode, and the n-electrode and the n-type GaN are made conductive. On the other hand, electrodes corresponding to the n-electrode and the p-electrode are arranged on the circuit board at the same pitch as the pitch between the n-electrode and the p-electrode. As a result, as shown in FIG. 10(b), the n-electrode and p-electrode of each LED are connected to the electric circuit board that controls the light emission of the three-color LEDs in one process by turning the light emitting unit upside down and face-down.

Further, the ratio of the light emitting areas of the green LED, the blue LED, and the red LED is set according to the same method as in the case of the vertical integration type.

B. Formation of Light Emitting Unit

1. Manufacturing Method 1

Figure 11:
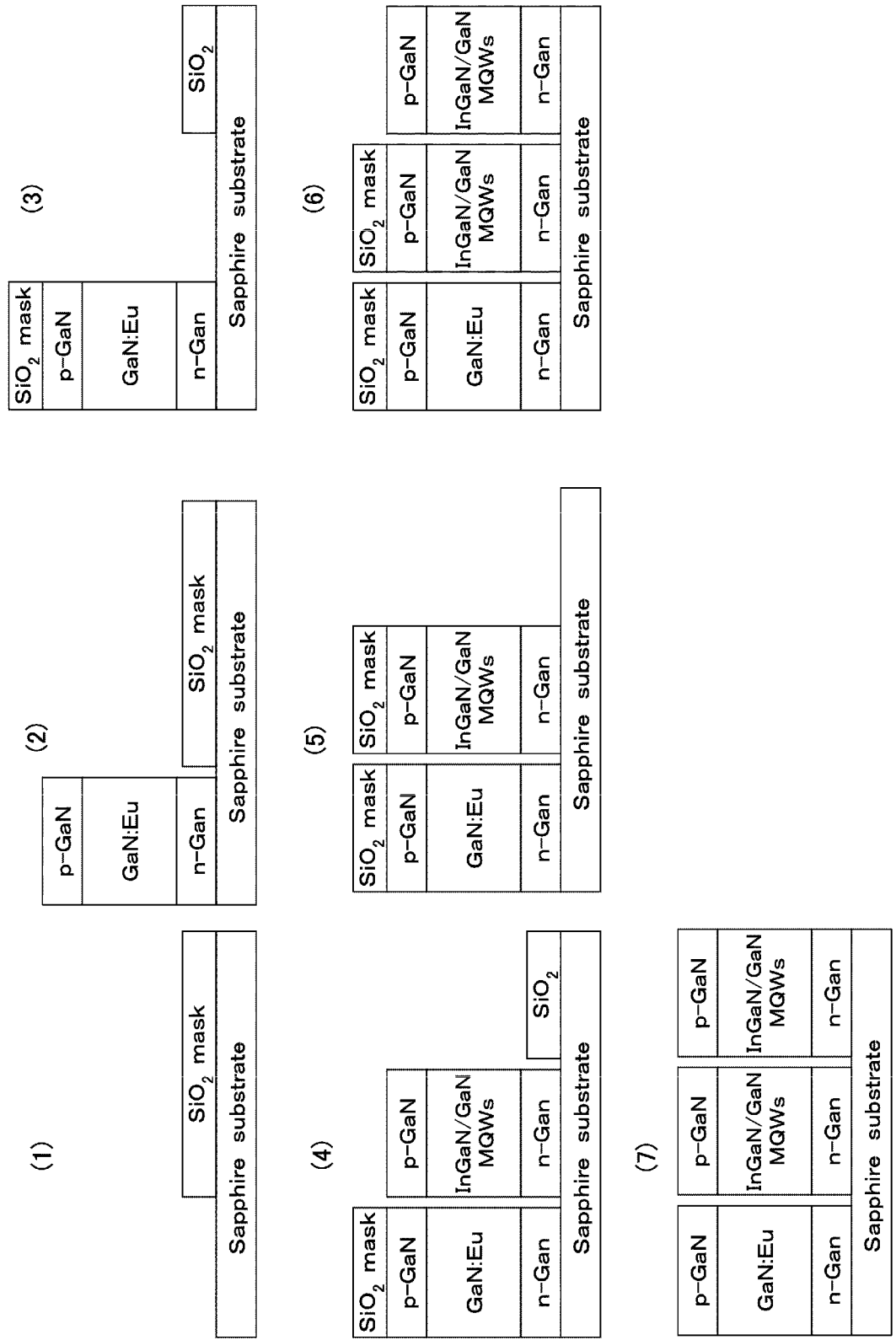
FIG. 11 A schematic diagram showing an example of the film formation process of the light emitting unit of the display device according to another embodiment of this invention.

The horizontal integration type light emitting unit in manufacturing method 1 is formed according to the following process. The numbers below correspond to the numbers in FIG. 11. It is known that the light emitting layer of a blue LED and a green LED containing In is deteriorated by a continuous high temperature process, and especially in a green LED requiring a high In concentration, the deterioration phenomenon is remarkable.

Therefore, the light emitting unit is formed in the order of red LED, blue LED, and green LED, in ascending order of In concentration.

(A) Substrate Formation (1) A mask material that inhibits crystal growth of a GaN-based semiconductor (for example, $SiO_2$, TiN, etc.) is formed on a part of the surface of a sapphire substrate by using a vapor deposition method, a sputtering method, a plasma CVD method, or the like.

(B) Red LED Formation (2) A red LED structure having a GaN: Eu layer as a light emitting layer is produced by an organometallic vapor phase epitaxy method on a surface in which the mask material produced above does not exist.

First, the low-temperature GaN layer is grown as a buffer layer (for example, at 475° C.), and then the undoped GaN layer is grown by about 0.5 to 5.0 μm (for example, at 1180° C.).

An n-type GaN layer to which Si is added is grown on the above layer by about 0.1 to 5.0 μm (for example, at 1180° C.). At this time, the Si concentration is controlled to about $10^{17}$ to $10^{22}/cm^3$. As the Si source, a raw material containing Si such as monomethylsilane ($CH_3SiH_3$) and trimethylsilane (($CH_3)_3SiH$) is supplied to the sample surface in the form of a gas.

On the above layer, a GaN: Eu layer to which Eu is added is grown by about 0.1 to 5.0 μm (for example, at 960° C.). At this time, the Eu concentration is controlled to be about $10^{17}$ to $10^{22}/cm^3$. As the Eu raw material, $EuCp^{pm}{}_2$, Eu $(DPM)_3$, and the like are used.

A p-type GaN layer (or p-type AlGaN layer) to which Mg is added is grown on the above layer by about 0.1 to 5000 nm (for example, at 1050° C.). At this time, the Mg concentration is controlled to be about $10^{17}$ to $10^{22}/cm^3$. As the Mg source, a raw material containing Mg such as $MgCp_2$ is supplied to the sample surface in the form of a gas.

(C) Blue LED Formation (3) After removing the mask material produced in (1) above by chemical etching, a mask material that inhibits the crystal growth of a GaN-based semiconductor (for example, $SiO_2$, TiN, etc.) is formed on a part of the sample surface by using a vapor deposition method, a sputtering method, a plasma CVD method, or the like.

(4) A blue LED structure having an InGaN layer as a light emitting layer is produced by an organometallic vapor phase epitaxy method on a surface in which the mask material produced above does not exist. First, the low-temperature GaN layer is grown as a buffer layer (for example, at 475° C.), and then the undoped GaN layer is grown by about 0.5 to 5.0 μm (for example, at 1180° C.).

An n-type GaN layer to which Si is added is grown on the above layer by about 0.1 to 5.0 μm (for example, at 1180° C.). At this time, the Si concentration is controlled to about $10^{17}$ to $10^{22}/cm^3$. As the Si source, a raw material containing Si such as monomethylsilane ($CH_3SiH_3$) and trimethylsilane (($CH_3)_3SiH$) is supplied to the sample surface in the form of a gas.

An InGaN quantum well structure is grown on the above layer by about 1 to 1000 nm (for example, at 715° C.). At this time, the InN mole fraction is controlled to be about 0.1 to 15%. Trimethylindium (TMIn) or the like is used as the In raw material.

A p-type GaN layer (or p-type AlGaN layer) to which Mg is added is grown on the above layer by about 0.1 to 5000 nm (for example, at 1050° C.). At this time, the Mg concentration is controlled to be about $10^{17}$ to $10^{22}/cm^3$. As the Mg source, a raw material containing Mg such as MgCp$_2$ is supplied to the sample surface in the form of a gas.

(D) Green LED Formation
- (5) After removing the mask material produced in (3) above by chemical etching, a mask material that inhibits the crystal growth of a GaN-based semiconductor (for example, SiO$_2$, TiN, etc.) is formed on a part of the sample surface by using a vapor deposition method, a sputtering method, a plasma CVD method, or the like.
- (6) A green LED structure having an InGaN layer as a light emitting layer is produced by an organometallic vapor phase epitaxy method on a surface in which the mask material produced above does not exist. First, the low-temperature GaN layer is grown as a buffer layer (for example, at 475° C.), and then the undoped GaN layer is grown by about 0.5 to 5.0 μm (for example, at 1180° C.).

An n-type GaN layer to which Si is added is grown on the above layer by about 0.1 to 5.0 μm (for example, at 1180° C.). At this time, the Si concentration is controlled to about $10^{17}$ to $10^{22}$/cm$^3$. As the Si source, a raw material containing Si such as monomethylsilane (CH$_3$SiH$_3$) and trimethylsilane ((CH$_3$)$_3$SiH) is supplied to the sample surface in the form of a gas.

An InGaN quantum well structure is grown on the above layer by about 1 to 1000 nm (for example, at 675° C.). At this time, the InN mole fraction is controlled to be about 15 to 40%. Trimethylindium (TMIn) or the like is used as the In raw material.

A p-type GaN layer (or p-type AlGaN layer) to which Mg is added is grown on the above layer by about 0.1 to 5000 nm (for example, at 1050° C.). At this time, the Mg concentration is controlled to be about $10^{17}$ to $10^{22}$/cm$^3$. As the Mg source, a raw material containing Mg such as MgCp$_2$ is supplied to the sample surface in the form of a gas.

- (7) The mask material formed in (5) above is removed by chemical etching. The order of (2), (4) and (6) may be changed.

C. Electrode Formation

Next, the electrode is formed. First, the n-electrode is formed by the process shown in FIG. 12, and then the p-electrode is formed by the process shown in FIG. 13. The n-electrode process number and the p-electrode forming process number are coded as the numbers in FIGS. 12 and 13, respectively.

Figure 12:
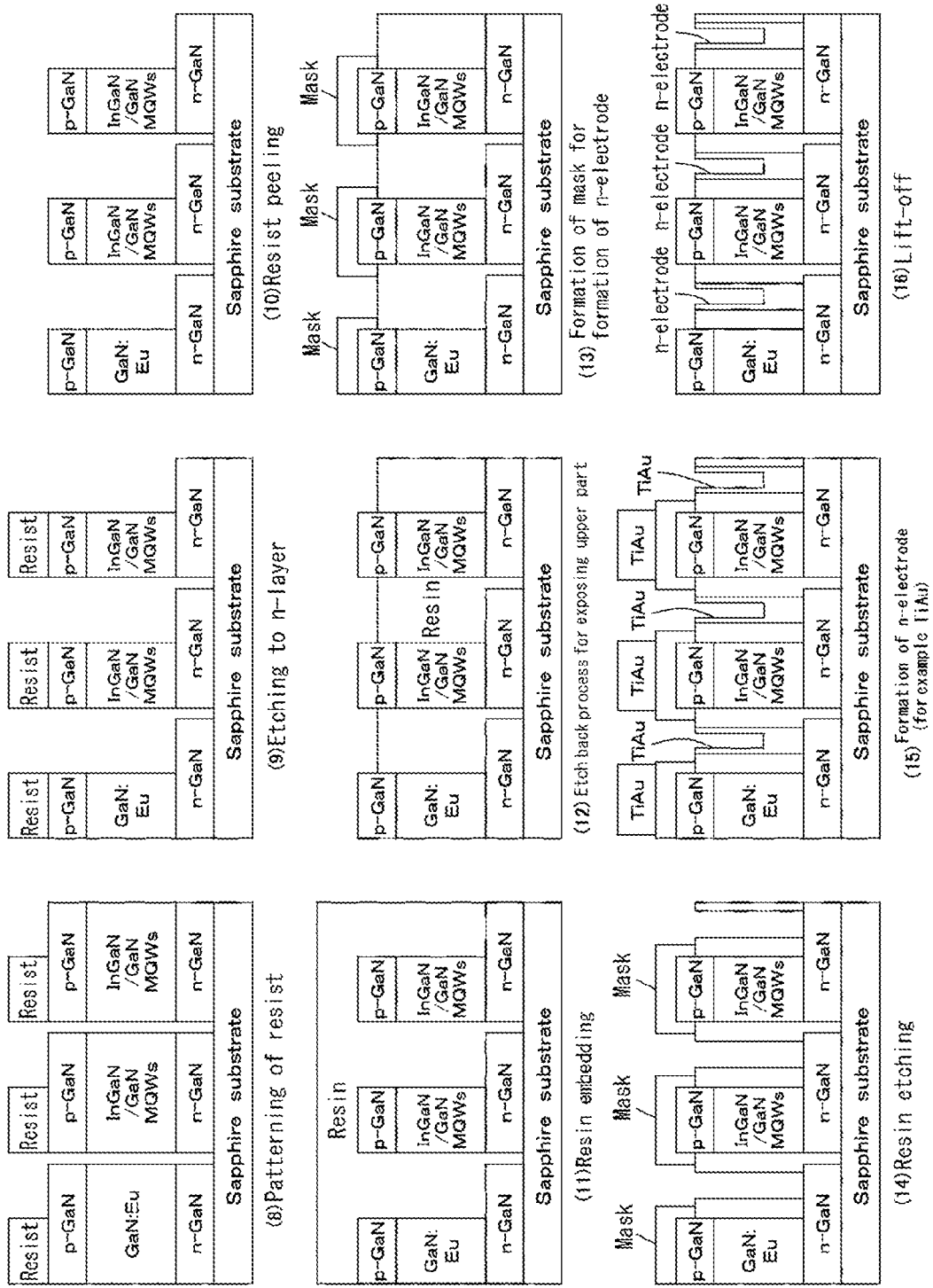
FIG. 12 A schematic diagram showing the formation process of the electrode of the light emitting unit of the display device according to another embodiment of this invention.
Figure 13:
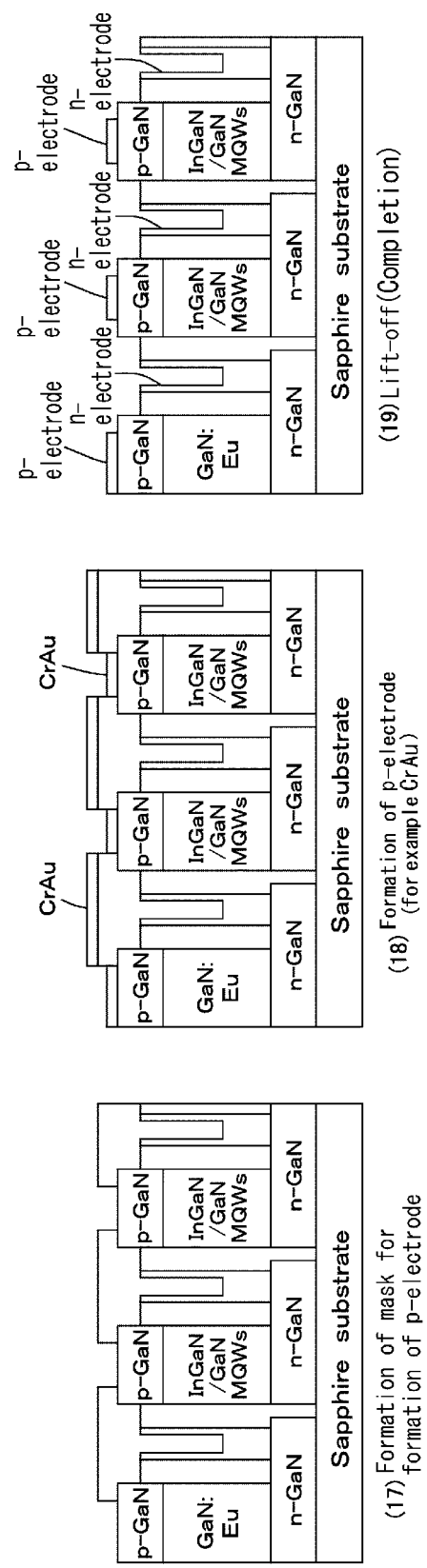
FIG. 13 A schematic diagram showing the formation process of an electrode of the display device according to another embodiment of this invention.

(A) Formation of n-electrode
- (8) Patterning of resist for n-layer region of each of the three-color LEDs
- (9) Dry etching up to the n-layer of each of the three-color LEDs
- (10) Resist peeling
- (11) Resin embedding: The structure (11) in FIG. 12 is embedded and flattened using a resin such as spin-on glass, bisbenzocyclobutene, or polydimethylsiloxane, which is initially liquid but solidifies by a chemical reaction such as heat or exposure. As the condition of the resin, one having transparency to visible light (RGB) (one having no or little absorption in the visible light region) is used.
- (12) Etching back until the upper part of p-GaN of each of the three-color LEDs is exposed by dry etching of the resin.
- (13) Patterning for forming each n-electrode of the three-color LEDs.
- (14) Etching of the resin (dry etching or wet etching)
- (15) Formation of n-electrode (material that can make ohmic contact with ordinary n-GaN. For example, TiAu: Titanium/Gold)
- (16) Electrode lift-off process by resist peeling (B) Formation of p-Electrode
- (17) Formation of mask for formation of p-electrode for each of the three-color LEDs.
- (18) Formation of p-electrode (A material that can make ohmic contact with ordinary p-GaN. For example, CrAu: Chromium/Gold)
- (19) Electrode lift off process by resist peeling (completion)

2. Manufacturing Method 2

A. Formation of Light Emitting Unit

Figure 14:
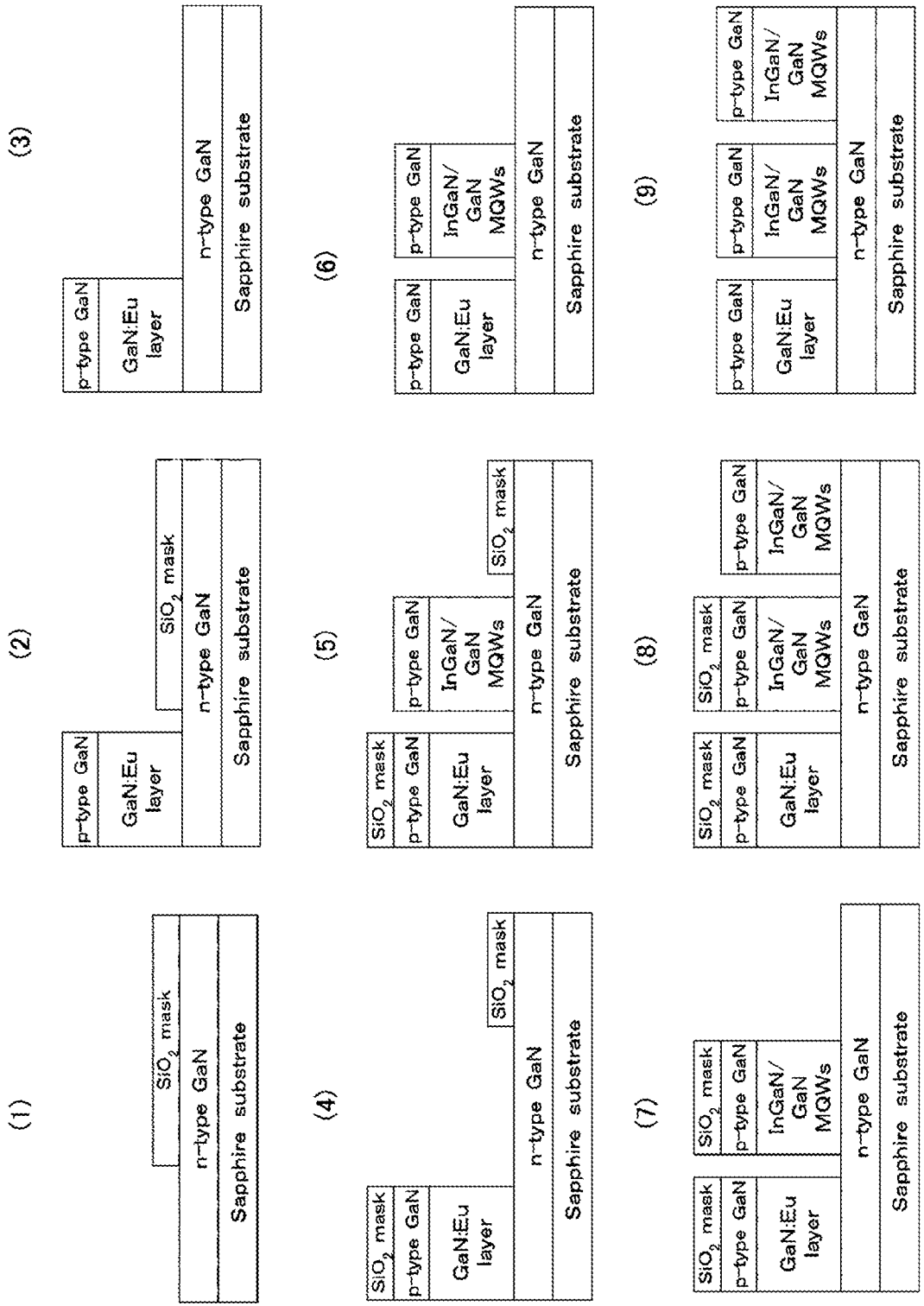
FIG. 14 A schematic diagram showing an example of the film formation process of the light emitting unit of the display device according to still another embodiment of this invention.

The horizontal integration type light emitting unit in the manufacturing method 2 is formed according to the following process. The numbers below correspond to the numbers in FIG. 14.

(a) Formation of Substrate
- (1) First, a low-temperature GaN layer is grown as a buffer layer on a sapphire substrate (for example, at 475° C.), and then an undoped GaN layer is grown for about 0.5 to 5.0 μm (for example, at 1180° C.).

(b) Formation of n-Type GaN Layer

An n-type GaN layer to which Si is added is grown on the above layer by about 0.1 to 5.0 μm (for example, at 1180° C.). At this time, the Si concentration is controlled to about $10^{17}$ to $10^{22}$/cm$^3$. As the Si source, a raw material containing Si such as monomethylsilane (CH$_3$SiH$_3$) and trimethylsilane ((CH$_3$)$_3$SiH) is supplied to the sample surface in the form of a gas.

(c) Red LED Formation

A mask material that inhibits crystal growth of a GaN-based semiconductor (for example, SiO$_2$ or TiN) is formed on a part of the surface of a sample by using a vapor deposition method, a sputtering method, a plasma CVD method, or the like.

- (2) A red LED structure having a GaN: Eu layer as a light emitting layer is produced by an organometallic vapor phase epitaxy method on a surface in which the mask material produced above does not exist. On the n-type GaN layer formed in (1), a GaN: Eu layer to which Eu is added is grown by about 0.1 to 5.0 μm (for example, at 960° C.). At this time, the Eu concentration is controlled to about $10^{17}$ to $10^{22}$/cm$^3$. EuCp$_{pm2}$, Eu(DPM)$_3$, and the like are used as the Eu raw material.

A p-type GaN layer (or p-type AlGaN layer) to which Mg is added is grown on the above layer by about 0.1 to 5000 nm (for example, at 1050° C.). At this time, the Mg concentration is controlled to be about $10^{17}$ to $10^{22}$/cm$^3$. As the Mg source, a raw material containing Mg such as MgCp$_2$ is supplied to the sample surface in the form of a gas.

(d) Blue LED Formation
- (3) The mask material produced in (1) above is removed by chemical etching.
- (4) A mask material that inhibits crystal growth of a GaN-based semiconductor (for example, SiO$_2$ or TiN) is formed on a part of the sample surface by using a vapor deposition method, a sputtering method, a plasma CVD method, or the like.
- (5) A blue LED structure having an InGaN layer as a light emitting layer is produced by an organometallic vapor phase epitaxy method on a surface in which the mask material produced above does not exist. An InGaN quantum well structure is grown on the n-type GaN layer produced in (1) by about 1 to 1000 nm (for example, at 715° C.). At this time, the InN mole fraction is controlled to be about 0.1 to 15%. Trimethylindium (TMIn) or the like is used as the In raw material.

A p-type GaN layer (or p-type AlGaN layer) to which Mg is added is grown on the above layer by about 0.1 to 5000 nm (for example, at 1050° C.). At this time, the Mg concentration is controlled to be about $10^{17}$ to $10^{22}/cm^3$. As the Mg source, a raw material containing Mg such as MgCp$_2$ is supplied to the sample surface in the form of a gas.

(e) Green LED Formation (6) The mask material produced in (4) above is removed by chemical etching.

(7) A mask material that inhibits crystal growth of a GaN-based semiconductor (for example, SiO$_2$ or TiN) is formed on a part of the sample surface by using a vapor deposition method, a sputtering method, a plasma CVD method, or the like.

(8) A green LED structure having an InGaN layer as a light emitting layer is produced by an organometallic vapor phase epitaxy method on a surface in which the mask material produced above does not exist. An InGaN quantum well structure is grown on the n-type GaN layer produced in (1) by about 1 to 1000 nm (for example, at 675° C.). At this time, the InN mole fraction is controlled to be about 15 to 40%. Trimethylindium (TMIn) or the like is used as the In raw material.

A p-type GaN layer (or p-type AlGaN layer) to which Mg is added is grown on the above layer by about 0.1 to 5000 nm (for example, at 1050° C.). At this time, the Mg concentration is controlled to be about $10^{17}$ to $10^{22}/cm^3$. As the Mg source, a raw material containing Mg such as MgCp$_2$ is supplied to the sample surface in the form of a gas.

(9) The mask material formed in (7) above is removed by chemical etching. The order of (2), (5) and (8) may be changed.

B. Electrode Formation

Figure 15:
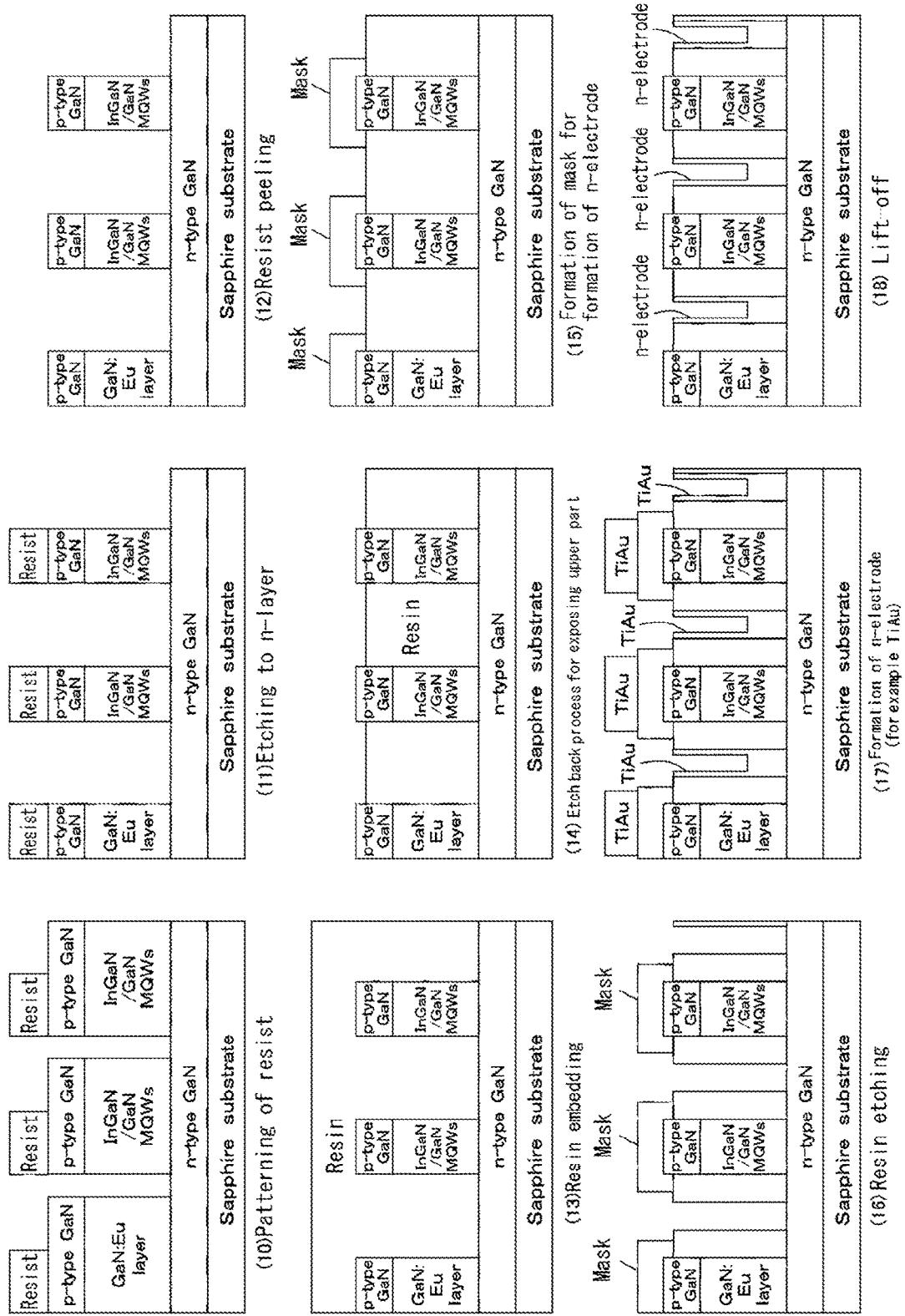
FIG. 15 A schematic diagram showing the formation process of an electrode of the display device according to still another embodiment of this invention.
Figure 16:
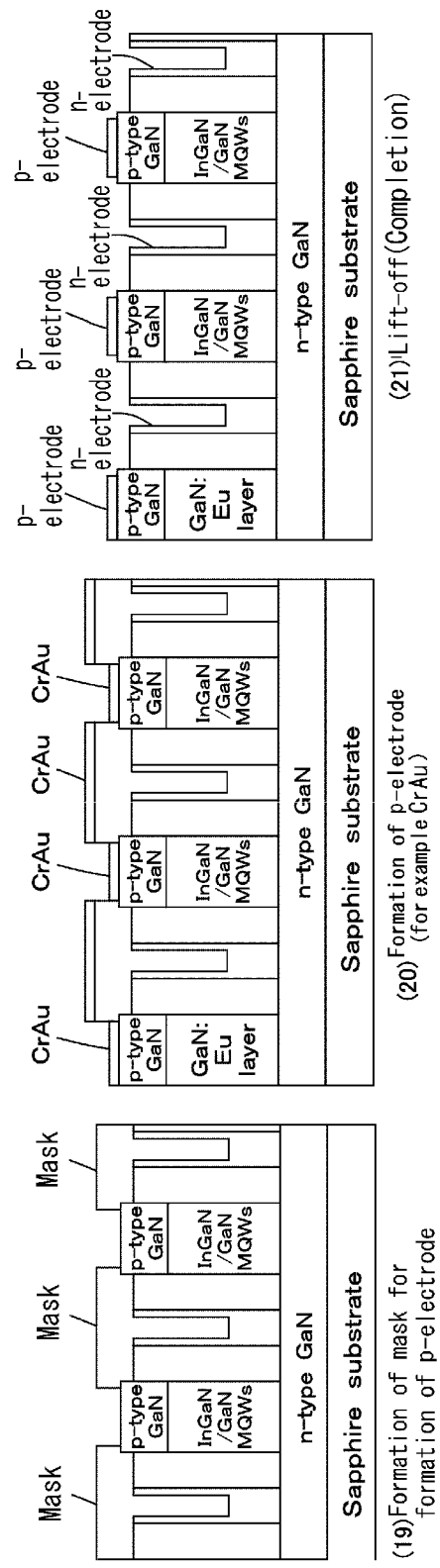
FIG. 16 A schematic diagram showing the formation process of an electrode of the display device according to still another embodiment of this invention. A schematic diagram showing an example of the film formation process of a light emitting unit.

Next, the electrode is formed. First, the n-electrode is formed by the process shown in FIG. 15, and then the p-electrode is formed by the process shown in FIG. 16. The n-electrode process number and the p-electrode forming process number are coded as the numbers in FIGS. 15 and 16, respectively.

(a) Formation of n-Electrode

(10) Patterning of resist for n-layer region common to three-color LEDs

(11) Dry etching up to n-layer

(12) Resist peeling

(13) Resin embedding: The structure (11) in FIG. 12 is embedded and flattened using a resin such as spin-on glass, bisbenzocyclobutene, or polydimethylsiloxane, which is initially liquid but solidifies by a chemical reaction such as heat or exposure. As the condition of the resin, one having transparency to visible light (RGB) (one having no or little absorption in the visible light region) is used.

(14) Etching back until the upper part of p-GaN of each of the three-color LEDs is exposed by dry etching of the resin.

(15) Mask formation for formation of n-electrode

(16) Etching of the resin (dry etching or wet etching)

(17) formation of n-electrode (a material that can make ohmic contact with ordinary n-GaN. For example, TiAu: Titanium/Gold)

(18) Electrode lift-off process by resist peeling (b) Formation of p-electrode

(19) Formation of mask for formation of p-electrode for each of the three-color LEDs.

(20) Formation of p-electrode (A material that can make ohmic contact with ordinary p-GaN. For example, CrAu: Chromium/Gold)

(21) Electrode lift-off process by resist peeling (completion)

In the above method, InGaN was used to form the active layers of both the green LED and the blue LED. Tb-added GaN (GaN: Tb) can also be used for the active layer of the green LED. GaN: Tb is preferable as the element characteristic, since the emission of Tb ions always shows green regardless of the amount of addition, the emission wavelength is always stable regardless of the temperature change or the amount of current injection, and light emission in a narrow band can be obtained. Further, when the Tb addition amount of GaN:Tb is $10^{22}/cm^3$ or more, the crystallinity of the GaN substrate is remarkably deteriorated. Therefore, it is preferable to control the Tb addition amount to less than $10^{22}/cm^3$.

Further, Tm-added GaN (GaN: Tm) can also be used for the active layer of the blue LED. TmGaN is preferable as the element characteristic since the emission of Tm ions always shows blue regardless of the amount of addition, the emission wavelength is always stable regardless of the temperature change or the amount of current injection, and emission in a narrow band can be obtained. Further, when the Tm addition amount of GaN: Tm is $10^{22}$ cm 3 or more, the crystallinity of the GaN substrate is remarkably deteriorated. Therefore, it is preferable to control the Tm addition amount to less than $10^{22}/cm^3$.

[4] Formation of Multi-Layer Wiring Structure

In the display device of the present embodiment, since the surface of the light emitting unit of is flat as described above, a drive driver for driving the light emitting unit can be integrally incorporated in the display unit. By forming a multi-layer wiring structure incorporating a drive driver, the driver mounting process can be simplified and the cost can be reduced. In addition, the mounting area can be reduced, and the display can be further improved in definition.

Figure 17:
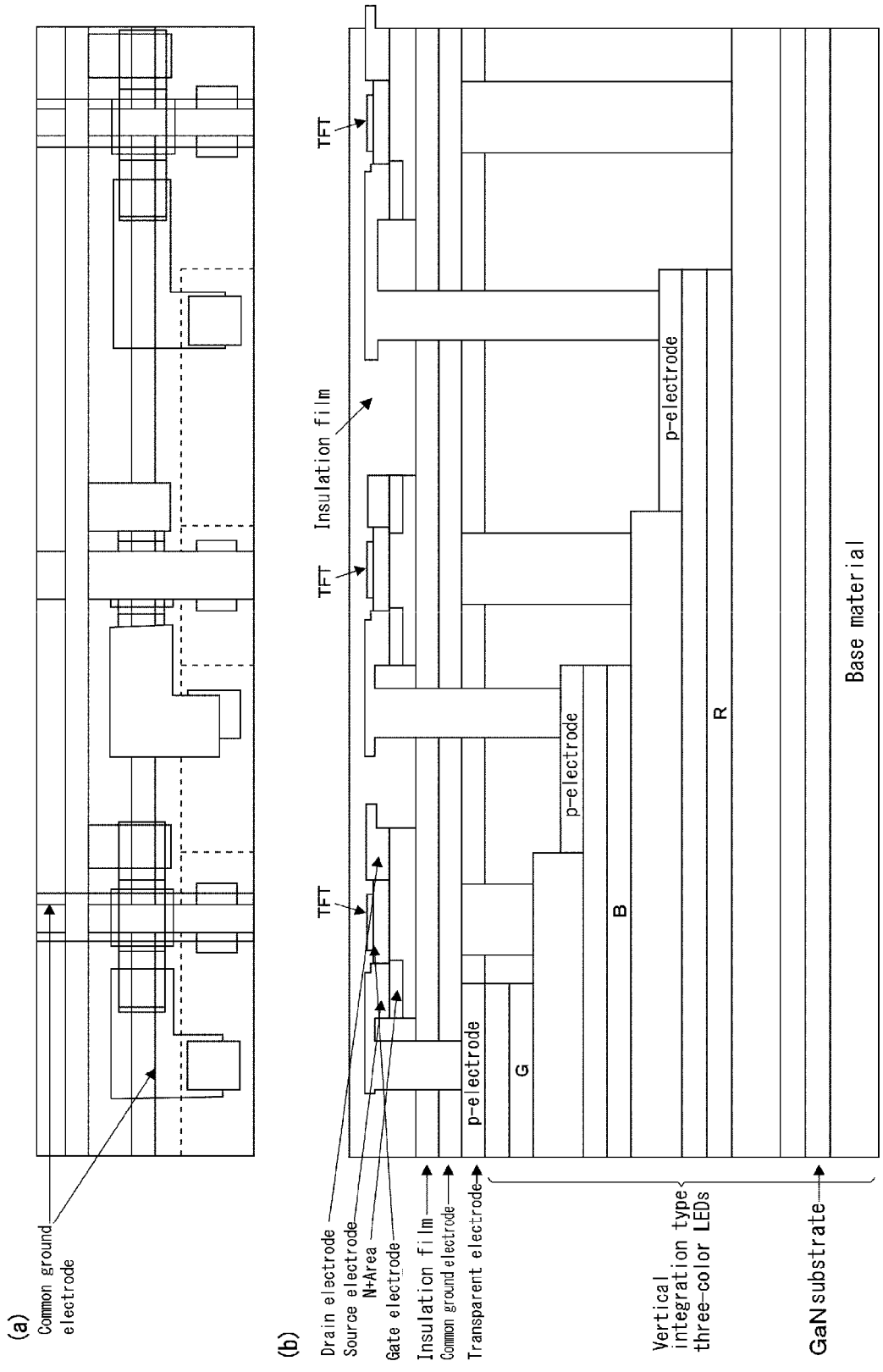
FIG. 17 A schematic diagram of the display device provided with a multi-layer wiring structure.
Figure 18:
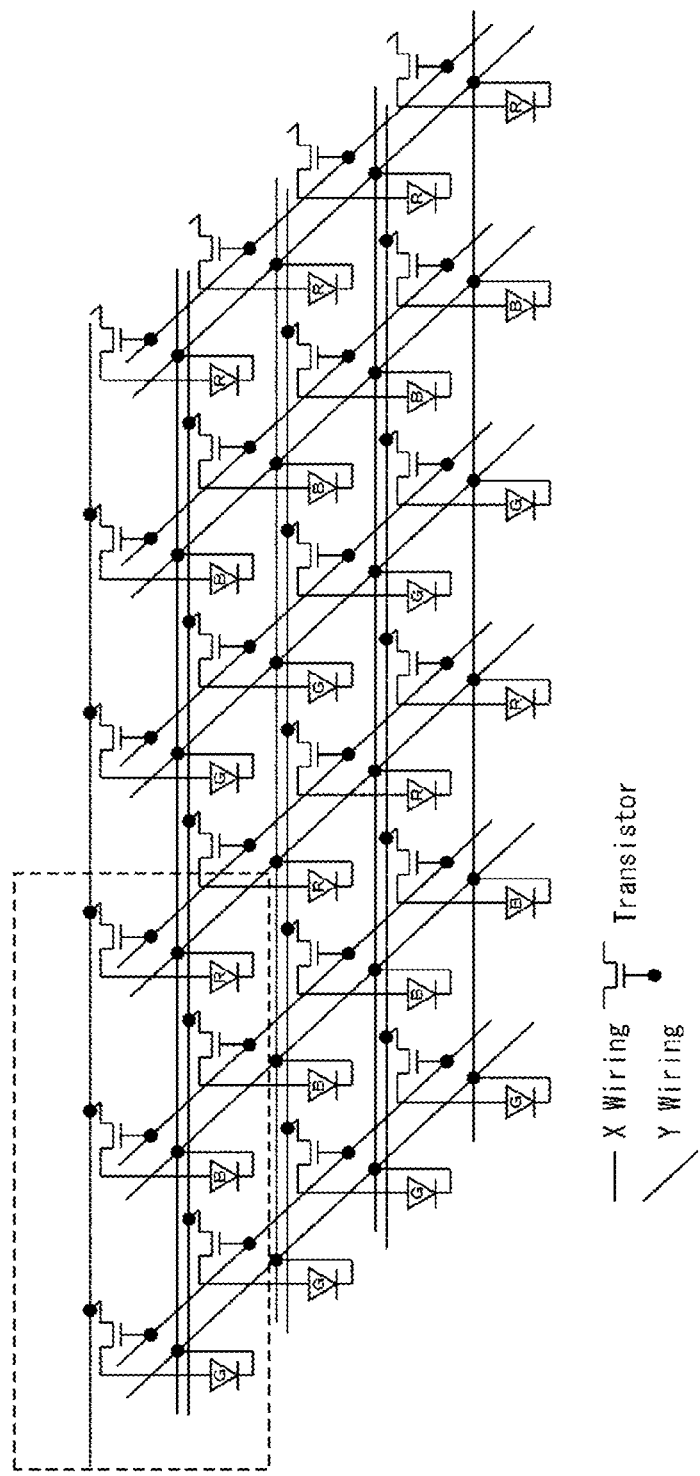
FIG. 18 A figure showing an example of the circuit of the multi-layer wiring structure.

FIG. 17 is a schematic view of a display device having a multi-layer wiring structure, (a) a top view, and (b) a cross-sectional view. Further, FIG. 18 is a diagram showing an example of a circuit having a multi-layer wiring structure, and a portion surrounded by a broken line shows a portion used for forming the multi-layer wiring structure of FIG. 17. A transistor is incorporated as an active element in a circuit forming the multi-layer wiring structure. As the transistor, the low-temperature poly-Si TFT used in the thin film transistor liquid crystal display is used, and one transistor is installed in each sub-pixel of the red diode, the blue diode, and the green diode. The source electrode of the transistor and each p-electrode (transparent electrode) of the three-color LED are connected by wiring.

Further, the n-type electrodes of the red diode, the blue diode, and the green diode of each pixel are connected so as to have a common potential by the wiring. When light is taken out from above, the wiring of the common potential is formed in a lattice structure. When light is taken out from below, the front surface of the pixel may be covered in order to improve the reflectance of light.

The low temperature poly Si TFT is generally manufactured by the following method.

First, (1) an insulator SiO$_2$ film is formed on the wiring having the common potential. (1) An amorphous Si film is formed on the SiO$_2$ film (on a glass substrate). When an amorphous Si film is formed by the P-CVD method, a dehydrogenation annealing treatment for removing hydrogen in the Si film is performed, and then polycrystallization is performed by excimer laser annealing. (2) Next, the polycrystalline Si film serving as the channel portion and the source/drain portion is etched to form a gate insulating film. After that, an Al-based metal which is a gate metal film is formed. Then, the gate metal film is processed. (3) After that, the side surface of the gate metal film is anodized to form an offset portion, and then the source/drain portion is doped with phosphorus and boron impurities at a high concentration. (4) After that, an interlayer insulating film is formed, a contact hole is opened, and a source/drain metal is further formed to form a poly Si TFT. In each sub-pixel, the source electrode of the TFT and the p-electrode of the LED are connected by wiring, and the drain electrode is connected to the power supply line.

In the present embodiment, the step of continuously forming the driving driver for driving the light emitting unit on the display unit is shown, but the present invention is not limited to this. It can also be realized that the TFT substrate for driving is formed and then connected to the light emitting unit. Further, the drive of each sub-pixel is formed by one TFT, but the present invention is not limited to this. It can be realized also by a TFT substrate for more stable drive such as two or more TFTs and one capacitor.

Figure 19:
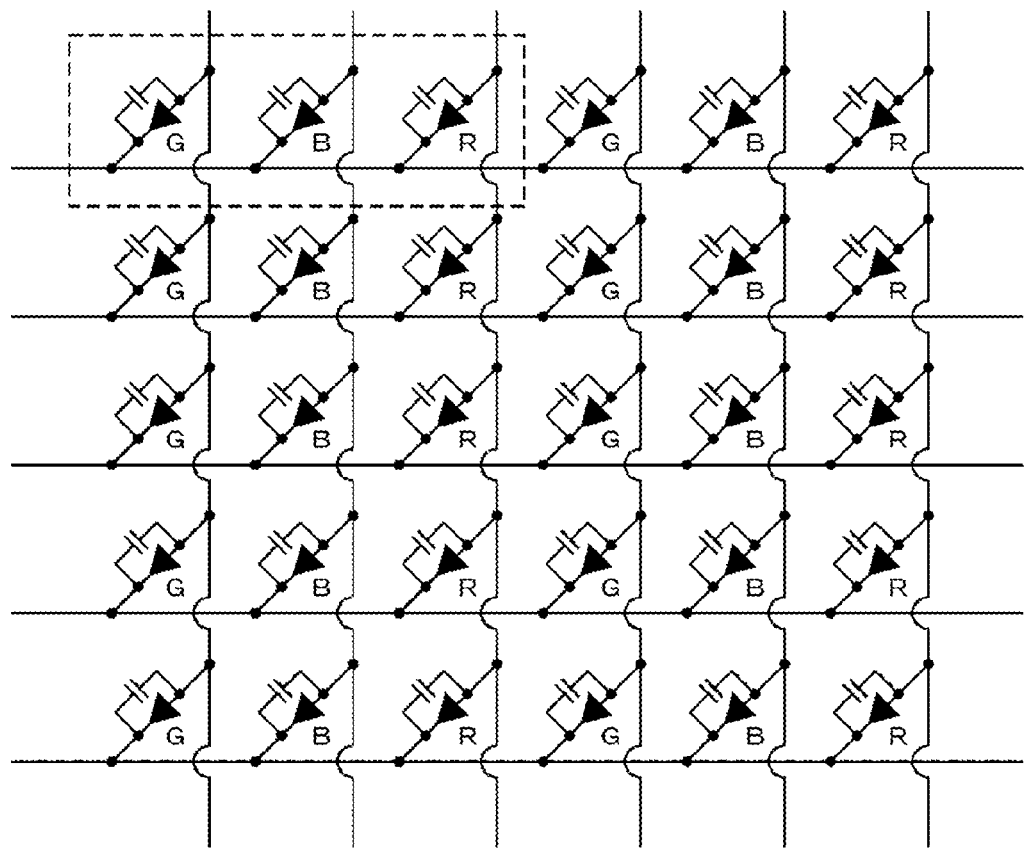
FIG. 19 A figure showing an example of the circuit of the multi-layer wiring structure.

For the purpose of making the configuration even simpler, when the number of scanning lines of one panel is small in the tiling type, a sub-pixel may be composed of one of green, blue, red, each LED and one stabilizing capacitor without providing a transistor (TFT). An example thereof is shown in FIG. 19. When the LED element structure itself has a sufficient capacitance component, it is not necessary to separately form a capacitance.

When a head-mounted display (HMD) or the like is configured based on the present embodiment, it is generally necessary to lay out a plurality of panels to configure the head-mounted display (HMD). In this case, a peripheral circuit part and a gap are inevitably present between the panels. As a result, an image cannot be displayed in that part which stands out as a frame, and a sufficient immersive feeling cannot be obtained.

Therefore, in a large tiling display, a method has been devised to make it inconspicuous by using a lens and image correction, but there is a problem that the frame part is inevitably visible from an oblique direction, though the frame is inconspicuous when the display is viewed from the front.

Figure 20:
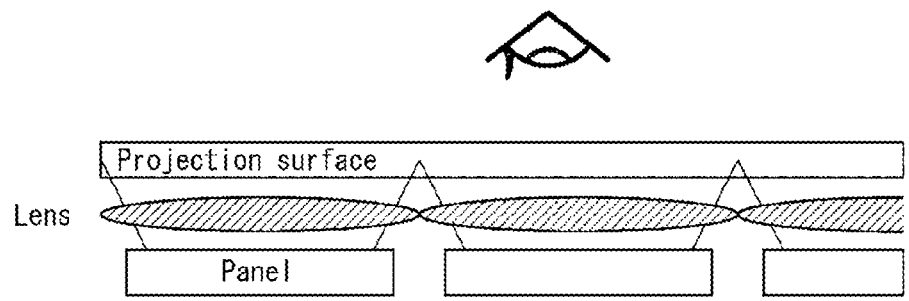
FIG. 20 A figure explaining the application to HMD of the display device according to this invention.

On the other hand, in the present embodiment, when applied to the HMD, this problem is solved by allowing the viewing of the video to be viewed only at the position facing the display screen. FIG. 20 shows an example of the present embodiment which will be specifically described. As shown in FIG. 20, in the present embodiment, a lens is arranged between the projection surface and the panel, and the panel image is enlarged and displayed on the projection surface. At this time, the panel position and the lens magnification are set so that there are no gaps in the image between the panels, and processing such as reduction and brightness correction is performed on the image in the required area such as the edge of the screen. As a result, the image is magnified by the lens, and the image in the tiling state can be viewed seamlessly, so that a sufficient immersive feeling can be obtained.

APPENDIX

Since the inventions described above can be generalized, the present invention also includes the following inventions.

The invention of Appendix 1 is a display device characterized in that, a light emitting unit that emits a plurality of different wavelengths is formed on the same substrate, and at least one active layer of the light emitting unit has a structure in which a rare earth element is contained.

The invention of Appendix 2 is the display device according to Appendix 1 characterized in that, the light emitting units emitting light of a plurality of different wavelengths have a structure in which the light emitting units are stacked close to the substrate in descending order of wavelength.

The invention of Appendix 3 is the display device according to Appendix 1 or Appendix 2 characterized in that, among the light emitting units emitting a light of a plurality of different wavelengths, at least the active layer of the light emitting unit for the longest wavelength contains a rare earth element.

The invention of Appendix 4 is the display device according to any one of Appendix 1 to Appendix 3 characterized in that, the light emitting area of the light emitting unit for the longest wavelength is the largest, among the light emitting units emitting a light of a plurality of different wavelengths.

The invention of Appendix 5 is the display device according to any one of Appendix 1 to Appendix 4 characterized in that, the light emitting unit emitting light of a plurality of different wavelengths has a stepped structure for forming an electrode through which an electric current flow.

The invention of Appendix 6 is the display device according to any one of Appendix 1 to Appendix 5 characterized in that, the light emitting unit emitting a plurality of different wavelengths has an insulator for flattening the surface of the stepped structure.

The invention of Appendix 7 is the display device according to any one of Appendix 1 to Appendix 6 characterized in that, a multi-layer wiring structure for forming an electric circuit is formed on the flattened surface of the light emitting unit emitting light of a plurality of different wavelengths, and the multi-layer wiring structure has at least one active element.

The invention of Appendix 8 is the display device according to Appendix 1 characterized in that, the light emitting unit emitting light of a plurality of different wavelengths is composed of three types of light emitting diodes, a red diode, a green diode, and a blue diode, and each of the red diode, the green diode, and the blue diode is arranged side by side on the substrate.

The invention of Appendix 9 is the display device according to Appendix 8 characterized in that, the gaps between the red diode, the green diode, and the blue diode arranged side by side are filled with an insulator, and the surface of the light emitting unit is flattened.

The invention of Appendix 10 is the display device according to any one of Appendix 1 to Appendix 9 characterized in that, the active layer is an active layer of gallium nitride (GaN) containing europium (Eu).

The invention of Appendix 11 is the display device according to any one of Appendix 1 to Appendix 10 characterized in that, the plurality types of light emitting diodes are composed of three types of light emitting diodes, a red diode, a green diode, and a blue diode, and the green diode has an active layer of gallium nitride (GaN) containing indium (In).

The invention of Appendix 12 is the display device according to any one of Appendix 1 to Appendix 10 characterized in that, the plurality types of light emitting diodes are composed of three types of light emitting diodes, a red diode, a green diode, and a blue diode, and the green diode has an active layer of gallium nitride (GaN) containing terbium (Tb) or erbium (Er) as the rare earth element.

The invention of Appendix 13 is the display device according to any one of Appendix 1 to Appendix 12 characterized in that, the plurality types of light emitting diodes are composed of three types of light emitting diodes, a red diode, a green diode, and a blue diode, and the blue diode has an active layer of gallium nitride (GaN) containing indium (In).

The invention of Appendix 14 is the display device according to any one of Appendix 1 to Appendix 12 characterized in that, the plurality types of light emitting diodes are composed of three types of light emitting diodes, a red diode, a green diode, and a blue diode, and the blue diode has a gallium nitride (GaN) active layer containing thurium (Tm).

The invention of Appendix 15 is the display device according to any one of Appendix 1 to Appendix 14 characterized in that, the plurality types of light emitting diodes are composed of three types of light emitting diodes, a red diode, a green diode, and a blue diode, and the red diode, the green diode, and the blue diode are arranged in a honeycomb shape on the substrate.

The invention of Appendix 16 is the display device according to any one of Appendix 1 to Appendix 15 which is configured to extract light to the substrate side, and characterized in that, the main surface of the substrate is subjected to fine unevenness processing.

The invention of Appendix 17 is a method for manufacturing a display device according to any one of Appendix 1 to Appendix 16, characterized in that the plurality of types of light emitting diodes are arranged in parallel on the substrate for the manufacturing.

The invention of Appendix 18 is a method for manufacturing a display device according to any one of Appendix 1 to Appendix 16, characterized in that the plurality of types of light emitting diodes are stacked on the substrate for the manufacturing.

Although the present invention has been described above based on the embodiments, the present invention is not limited to the above embodiments. Within the same and equivalent scope as the present invention, various modifications can be made to the above embodiments.

What is claimed is:

1. A display device comprising three types of PiN junction type light emitting diodes that emit light having different wavelengths from each other of red, green, and blue, stacked on the same substrate characterized in that, the red diode includes a light emitting unit having an active layer containing a rare earth element and emitting light due to f-f transition;
the green diode and the blue diode each include a light emitting unit composed of elements different from those of the light emitting unit of the red diode, and emitting light due to transition across the band gaps respectively; and the stacking order of the red diode, the green diode, and the blue diode can be set freely.

2. The display device according to claim 1 characterized in that, the light emitting diodes are stacked in the order of a red diode, a green diode, and a blue diode from the substrate side.

3. The display device according to claim 2 characterized in that, the light is taken out from the substrate side.

4. The display device according to claim 1 characterized in that, the substrate is a gallium nitride substrate, and the red diode has a gallium nitride-based (GaN-based) active layer containing europium (Eu) as the rare earth element.

5. The display device according to claim 1 characterized in that, the three types of light emitting diodes are sequentially stacked on the surface of the substrate, and are formed wherein, on at least a part of a light emitting layer corresponding to one color, a light emitting layer corresponding to another color is superimposed.

6. The display device according to claim 1 characterized in that, the light emitting unit included in the green diode and the blue diode has a stepped structure in which a step is formed on a surface side of the light emitting unit included in the green diode and the blue diode to form an electrode for energizing the light emitting diode of each of the green diode and the blue diode.

7. The display device according to claim 6 characterized in that, the recess formed by the step is filled with an insulator and the surface of the light emitting unit is flattened.

8. The display device according to claim 7 characterized in that, the insulator is made of any of a visible light permeable resin material, a visible light opaque resin material, and a resin material that reflects visible light.

9. The display device according to claim 1 characterized in that, a barrier layer formed of any of AlN, AlGaN, AlInN, and AlGaInN is provided at the interface between the red diode and the green diode and at the interface between the green diode and the blue diode, when the light emitting unit is stacked in the order of the red diode, the green diode and the blue diode from the substrate side, or
at the interface between the red diode and the blue diode and at the interface between the blue diode and the green diode, when the light emitting unit is stacked in the order of the red diode, the blue diode, and the green diode from the substrate side.

10. The display device according to claim 1 characterized in that, a DBR structure in which AlInN and GaN are stacked, AlGaN and GaN are stacked, or AlGaInN and GaN are stacked is formed
at the interface between the red diode and the green diode and at the interface between the green diode and the blue diode, when the light emitting unit is stacked in the order of the red diode, the green diode and the blue diode from the substrate side, or
at the interface between the red diode and the blue diode and at the interface between the blue diode and the green diode, when the light emitting unit is stacked in the order of the red diode, the blue diode, and the green diode from the substrate side.

11. The display device according to claim 1 characterized in that, a multi-layer wiring structure for forming an electric circuit is formed on a surface of the light emitting unit included in the red diode, the green diode and the blue diode, and the multi-layer wiring structure includes at least one active element.

12. The display device according to claim 1 characterized in that, a multi-layer wiring structure for forming an electric circuit is formed on a surface of the light emitting unit included in the red diode, the green diode and the blue diode, and the multi-layer wiring structure is a passive matrix type structure that does not include an active element.

13. The display device according to claim 1 characterized in that, the blue diode, the green diode, and the red diode are arranged in a pentile shape.

14. A method for manufacturing the display device according to claim 1 which has formation of the light emitting unit of the plurality types of light emitting diodes using a metalorganic vapor phase growth method.

15. A method for manufacturing the display device according to claim 2 which has formation of the light emitting unit of the plurality types of light emitting diodes using a metalorganic vapor phase growth method.

16. A method for manufacturing the display device according to claim 3 which has formation of the light emitting unit of the plurality types of light emitting diodes using a metalorganic vapor phase growth method.

17. A method for manufacturing the display device according to claim 4 which has formation of the light emitting unit of the plurality types of light emitting diodes using a metalorganic vapor phase growth method.

18. A method for manufacturing the display device according to claim 5 which has formation of the light emitting unit of the plurality types of light emitting diodes using a metalorganic vapor phase growth method.

19. A method for manufacturing the display device according to claim 6 which has formation of the light emitting unit of the plurality types of light emitting diodes using a metalorganic vapor phase growth method.

20. A method for manufacturing the display device according to claim 7 which has formation of the light emitting unit of the plurality types of light emitting diodes using a metalorganic vapor phase growth method.

* * * * *